US012586633B2

(12) United States Patent     (10) Patent No.: US 12,586,633 B2
Berman et al.     (45) Date of Patent: Mar. 24, 2026

(54) FAST PROGRAMMING SCHEME FOR POWER LOSS PROTECTION—A MACHINE LEARNING BASED ALGORITHM

(71) Applicant: SAMSUNG ELECTRONICS CO., LTD., Suwon-si (KR)

(72) Inventors: Amit Berman, Tel Aviv (IL); Karen Michaeli, Tel Aviv (IL); Evgeny Blaichman, Tel Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 18/732,942

(22) Filed: Jun. 4, 2024

(65) Prior Publication Data

US 2025/0372155 A1    Dec. 4, 2025

(51) Int. Cl.
| | |
|---|---|
| *G11C 11/04* | (2006.01) |
| *G11C 11/408* | (2006.01) |
| *G11C 11/4093* | (2006.01) |
| *G11C 11/4096* | (2006.01) |
| *G11C 11/54* | (2006.01) |

(52) U.S. Cl.
CPC ...... *G11C 11/4096* (2013.01); *G11C 11/4085* (2013.01); *G11C 11/4093* (2013.01); *G11C 11/54* (2013.01)

(58) Field of Classification Search
CPC .................................................... G06F 3/06
See application file for complete search history.

(56) References Cited

U.S. PATENT DOCUMENTS

| | | | | |
|---|---|---|---|---|
| 10,061,694 | B2 * | 8/2018 | Shibatani | ............... G11C 16/10 |
| 2009/0237996 | A1 | 9/2009 | Kirsch et al. | |
| 2016/0154597 | A1 * | 6/2016 | McKelvie | ............... G06F 21/79 |
| | | | | 711/162 |
| 2018/0024764 | A1 * | 1/2018 | Miller | ................. G06F 13/4068 |
| 2018/0075907 | A1 | 3/2018 | Widjaja | |
| 2018/0330793 | A1 * | 11/2018 | Tang | .................. G11C 16/3459 |
| 2019/0333548 | A1 * | 10/2019 | McGlaughlin | ........... G11C 5/14 |

OTHER PUBLICATIONS

Extended European Search Report dated Oct. 28, 2025, issued by the European Patent Office in European Application No. 25179649.6.

* cited by examiner

*Primary Examiner* — Khoa D Doan
(74) *Attorney, Agent, or Firm* — Sughrue Mion, PLLC

(57) ABSTRACT

A storage device, including a volatile memory; a non-volatile memory; and a storage controller: wherein, based on detecting a power loss corresponding to the storage device, the storage controller is configured to: obtain a word stored in the volatile memory; write the word to a first word line; compare a number of unprogrammed cells to a first threshold number and a second threshold number, wherein the unprogrammed cells correspond to remainder data; based on determining that the number of unprogrammed cells is less than or equal to the first threshold number and greater than the second threshold number, determine whether to continue writing the word to the first word line by providing information about the first word line to a machine learning model; and based on determining not to continue writing the word to the first word line, write the remainder data to a second word line.

18 Claims, 16 Drawing Sheets

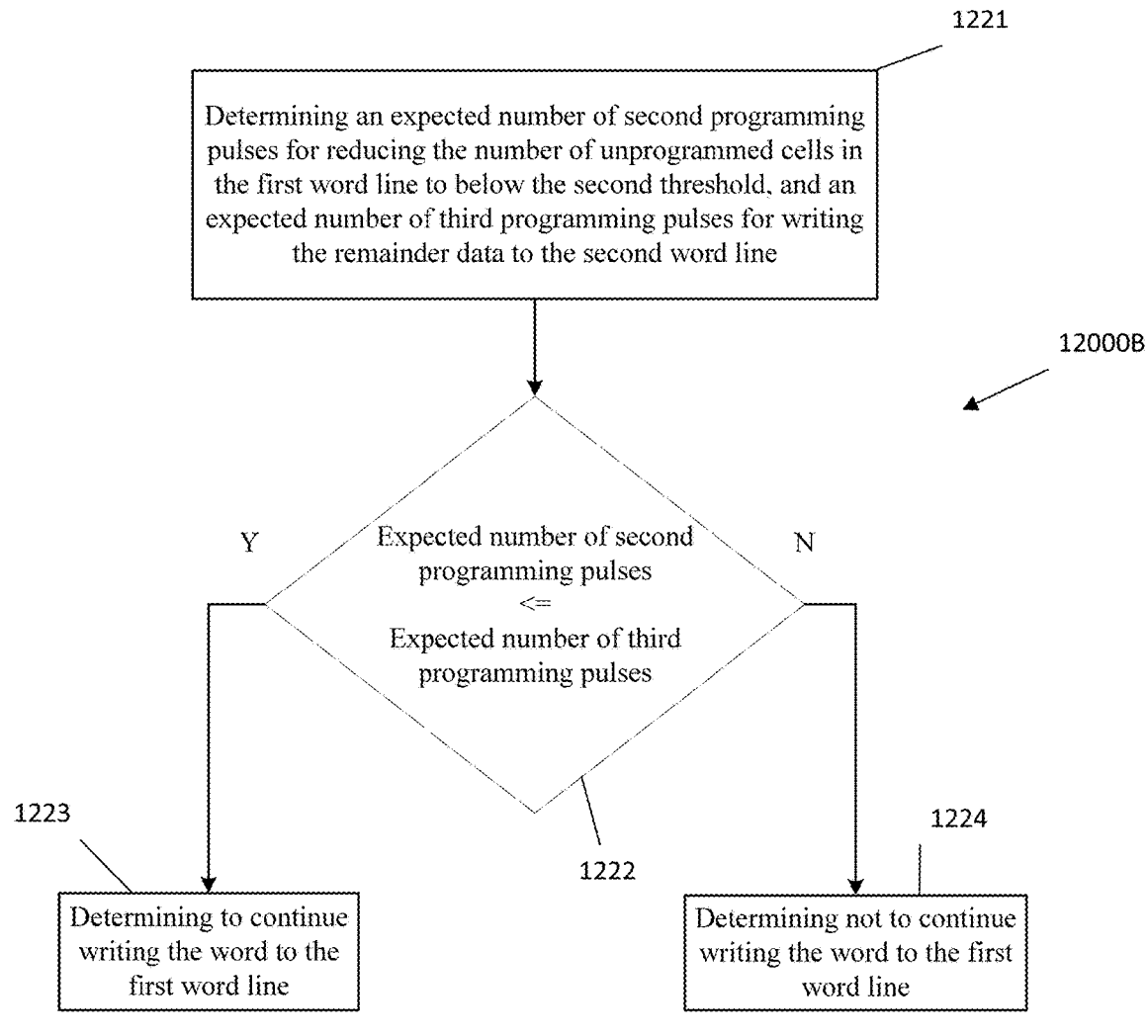

1221

Determining an expected number of second programming pulses for reducing the number of unprogrammed cells in the first word line to below the second threshold, and an expected number of third programming pulses for writing the remainder data to the second word line

12000B

Y

Expected number of second programming pulses
<=
Expected number of third programming pulses

N

1223

1222

1224

Determining to continue writing the word to the first word line

Determining not to continue writing the word to the first word line

FAST PROGRAMMING SCHEME FOR POWER LOSS PROTECTION—A MACHINE LEARNING BASED ALGORITHM

BACKGROUND

1. Field

The present disclosure relates to a process for performing power loss protection in a storage device, and more particularly to a machine learning assisted programming scheme for power loss protection.

2. Description of Related Art

A storage device such as a solid-state drive may include a non-volatile memory (NVM) such as a NAND flash memory for storing data, and may also a volatile memory (VM) such as a dynamic random-access memory (DRAM) for caching or buffering the data as it is written to, or read from, the NVM. If a power supply to the storage device is interrupted while data is stored in the VM, the data may be corrupted or lost.

Therefore, some storage devices which include VMs may also include a backup power supply, which may be implemented using capacitors which charged while power is supplied to the storage device. Upon detecting an abrupt loss of power, the storage device may operate by discharging the capacitors to provide enough current to flush data from the VM to the NVM. For example, the backup power supply may include electrolytic capacitors or super-capacitors, which may have relatively high capacitance, compact size, durable quality, and stable parameters, in comparison with other types of capacitors.

SUMMARY

Provided are systems, apparatuses, and methods for performing power loss protection using a machine learning based programming scheme.

Additional aspects will be set forth in part in the description which follows and, in part, will be apparent from the description, or may be learned by practice of the presented embodiments.

In accordance with an aspect of the disclosure, a storage device includes a volatile memory; a non-volatile memory; and a storage controller: wherein, based on detecting a power loss corresponding to the storage device, the storage controller is configured to: obtain a word stored in the volatile memory; write the word to a first word line from among a plurality of word lines included in the non-volatile memory; compare a number of unprogrammed cells included in the first word line to a first threshold number and a second threshold number, wherein the unprogrammed cells correspond to remainder data included in the word; based on determining that the number of unprogrammed cells is less than or equal to the first threshold number and greater than the second threshold number, determine whether to continue writing the word to the first word line by providing information about the first word line to a machine learning model; and based on determining not to continue writing the word to the first word line, write the remainder data to a second word line from among the plurality of word lines.

In accordance with an aspect of the disclosure, a storage controller includes at least one processor, wherein, based on detecting a power loss corresponding to the storage device, the at least one processor is configured to: obtain a first word from a volatile memory included in the storage device; apply first programming pulses to a first word line from among a plurality of word lines to write a word to the first word line, wherein the plurality of word lines are included in a non-volatile memory included in the storage device; determine a number of unprogrammed cells, wherein the unprogrammed cells correspond to remainder data included in the word; based on determining that the number of unprogrammed cells is less than or equal to a first threshold number, determine an expected number of second programming pulses for reducing the number of unprogrammed cells in the first word line to below a second threshold number, and an expected number of third programming pulses for writing the remainder data to a second word line; compare the expected number of second programming pulses and the expected number of third programming pulses to obtain a comparison result; and write the remainder data to the first word line or the second word line based on the comparison result.

In accordance with an aspect of the disclosure, a method of storing data in a storage device includes writing a word to a first word line from among a plurality of word lines; comparing a number of unprogrammed cells included in the first word line to a first threshold number and a second threshold number, wherein the unprogrammed cells correspond to remainder data included in the word; based on determining that the number of unprogrammed cells is less than or equal to the first threshold number and greater than the second threshold number, determining whether to continue writing the word to the first word line by providing information about the first word line to a machine learning model; and based on determining not to continue writing the word to the first word line, writing the remainder data to a second word line from among the plurality of word lines.

In accordance with an aspect of the disclosure, a method of storing data in a storage device includes applying first programming pulses to a first word line from among a plurality of word lines to write a word to the first word line; determining a number of unprogrammed cells, wherein the unprogrammed cells correspond to remainder data included in the word; based on determining that the number of unprogrammed cells is less than or equal to a first threshold number, determining an expected number of second programming pulses for reducing the number of unprogrammed cells in the first word line to below a second threshold number, and an expected number of third programming pulses for writing the remainder data to a second word line; comparing the expected number of second programming pulses and the expected number of third programming pulses to obtain a comparison result; and writing the remainder data to the first word line or the second word line based on the comparison result.

BRIEF DESCRIPTION OF DRAWINGS

The above and other aspects, features, and advantages of certain embodiments of the present disclosure will be more apparent from the following description taken in conjunction with the accompanying drawings, in which:

FIGS. 12A-12B are flowcharts of processes for controlling a storage system, according to embodiments.

DETAILED DESCRIPTION

In some embodiments, for storage devices including electrolytic capacitors or super-capacitors as backup power supply for flushing data from VM to NVM, the electrolytic capacitors or super-capacitors may exhibit a continuous voltage discharge at constant current. Therefore, as these capacitors discharge, the number of programming pulses used to write data to the NVM may increase. In addition, these capacitors may be relatively expensive, and therefore it may be desirable to implement the backup power supply with a minimum number of capacitors. Accordingly, there is a need for a fast writing scheme that minimizes the number of pulses.

Figure 1:
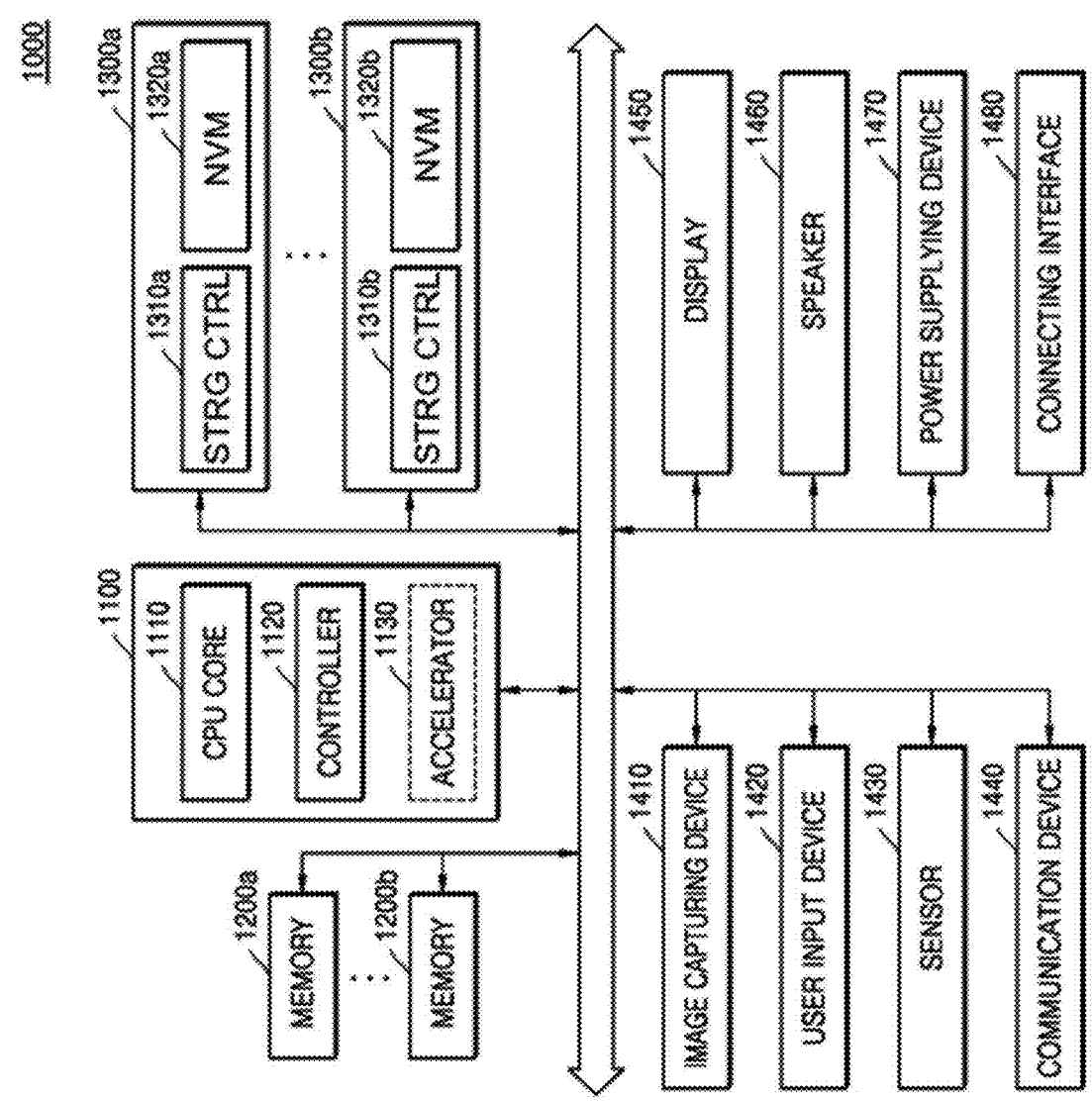
FIG. 1 is a block diagram of a computer system, according to embodiments.

FIG. 1 is a diagram of a system 1000 to which embodiments may be applied. The system 1000 of FIG. 1 may be, for example, a mobile system, such as a portable communication terminal (e.g., a mobile phone), a smartphone, a tablet personal computer (PC), a wearable device, a healthcare device, or an Internet of things (IoT) device. However, the system 1000 of FIG. 1 is not necessarily limited to the mobile system and may be a PC, a laptop computer, a server, a media player, or an automotive device (e.g., a navigation device).

Referring to FIG. 1, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, embodiments are not limited thereto, and the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of SSDs or memory cards, and may be removably combined with other components of the system 1000 through an interface, such as the connecting interface 1480 described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2:
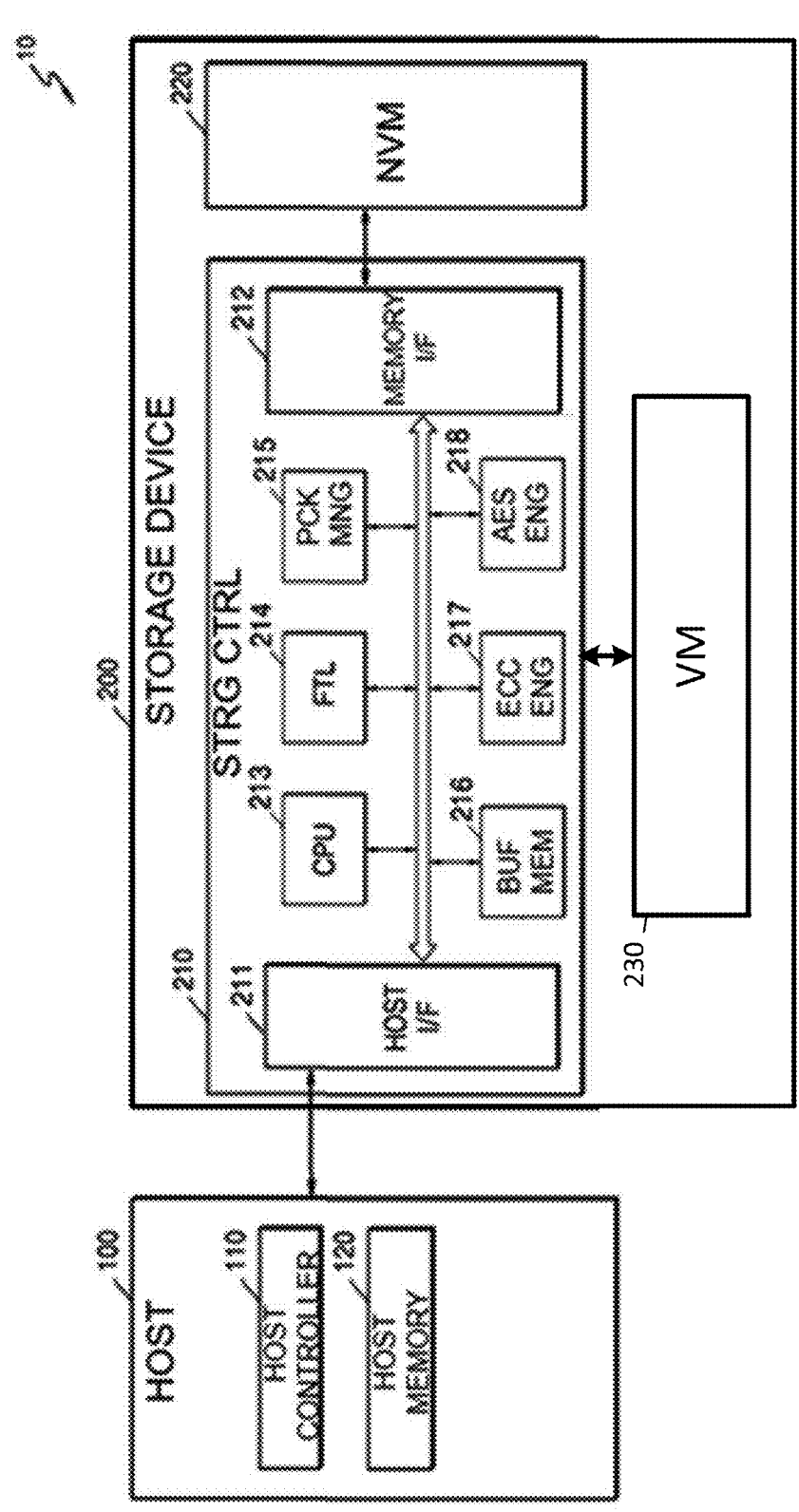
FIG. 2 is a block diagram of a host storage system, according to embodiments.

FIG. 2 is a block diagram of a host storage system 10 according to an example embodiment.

The host storage system 10 may include a host 100 and a storage device 200. Further, the storage device 200 may include a storage controller 210, an NVM 220, and a VM 230. According to an example embodiment, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controller 210 may further include a flash translation layer (FTL) 214, a packet manager 215, a buffer memory 216, an error correction code (ECC) engine 217, and an advanced encryption standard (AES) engine 218. The storage controller 210 may further include a working memory in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controller 210, the buffer memory 216 may be outside the storage controller 210.

In embodiments, the VM 230 may temporarily store (or buffer) data to be written to the NVM 220, or data read from the NVM 220. Also, the VM 230 may store metadata. Here, the metadata may be user data or data generated by the storage controller 210 to manage the NVM 220. In embodiments, the VM 230 may include DRAM memory, and the NVM 220 may include NAND flash memories. However, embodiments are not limited thereto.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controller 210 by using a symmetric-key algorithm.

Figure 3:
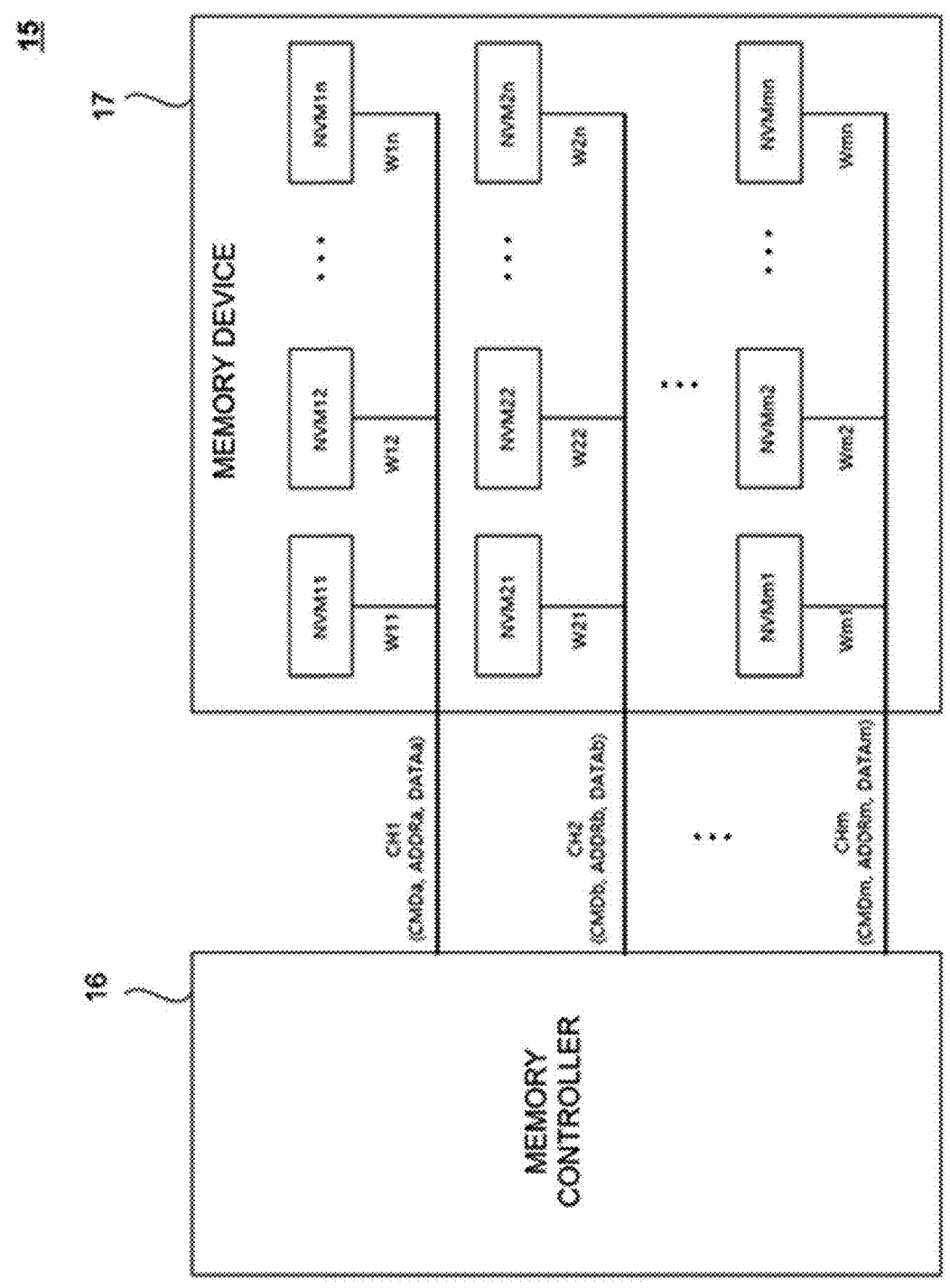
FIG. 3 is a block diagram of a memory system, according to embodiments.

FIG. 3 is a block diagram of a memory system 15 according to embodiments. Referring to FIG. 3, the memory system 15 may include a memory device 17 and a memory controller 16. The memory system 15 may support a plurality of channels CH1 to CHm, and the memory device 17 may be connected to the memory controller 16 through the plurality of channels CH1 to CHm. For example, the memory system 15 may be implemented as a storage device, such as an SSD.

The memory device 17 may include a plurality of NVM devices NVM11 to NVMmn. Each of the NVM devices NVM11 to NVMmn may be connected to one of the plurality of channels CH1 to CHm through a way corresponding thereto. For instance, the NVM devices NVM11 to NVM1n may be connected to a first channel CH1 through ways W11 to Win, and the NVM devices NVM21 to NVM2n may be connected to a second channel CH2 through ways W21 to W2n. In an example embodiment, each of the NVM devices NVM11 to NVMmn may be implemented as an arbitrary memory unit that may operate according to an individual command from the memory controller 16. For example, each of the NVM devices NVM11 to NVMmn may be implemented as a chip or a die, but the embodiments of the disclosure are not limited thereto.

The memory controller 16 may transmit and receive signals to and from the memory device 17 through the plurality of channels CH1 to CHm. For example, the memory controller 16 may transmit commands CMDa to CMDm, addresses ADDRa to ADDRm, and data DATAa to DATAm to the memory device 17 through the channels CH1 to CHm or receive the data DATAa to DATAm from the memory device 17.

The memory controller 16 may select one of the NVM devices NVM11 to NVMmn, which is connected to each of the channels CH1 to CHm, by using a corresponding one of the channels CH1 to CHm, and transmit and receive signals to and from the selected NVM device. For example, the memory controller 16 may select the NVM device NVM11 from the NVM devices NVM11 to NVM1n connected to the first channel CH1. The memory controller 16 may transmit the command CMDa, the address ADDRa, and the data DATAa to the selected NVM device NVM11 through the first channel CH1 or receive the data DATAa from the selected NVM device NVM11.

The memory controller 16 may transmit and receive signals to and from the memory device 17 in parallel through different channels. For example, the memory controller 16 may transmit a command CMDb to the memory device 17 through the second channel CH2 while transmitting a command CMDa to the memory device 17 through the first channel CH1. For example, the memory controller 16 may receive data DATAb from the memory device 17 through the second channel CH2 while receiving data DATAa from the memory device 17 through the first channel CH1.

The memory controller 16 may control all operations of the memory device 17. The memory controller 16 may transmit a signal to the channels CH1 to CHm and control each of the NVM devices NVM11 to NVMmn connected to the channels CH1 to CHm. For instance, the memory controller 16 may transmit the command CMDa and the address ADDRa to the first channel CH1 and control one selected from the NVM devices NVM11 to NVM1n.

Each of the NVM devices NVM11 to NVMmn may operate via the control of the memory controller 16. For example, the NVM device NVM11 may program the data DATAa based on the command CMDa, the address ADDRa, and the data DATAa provided to the first channel CH1. For example, the NVM device NVM21 may read the data DATAb based on the command CMDb and the address ADDb provided to the second channel CH2 and transmit the read data DATAb to the memory controller 16.

Although FIG. 3 illustrates an example in which the memory device 17 communicates with the memory controller 16 through m channels and includes n NVM devices corresponding to each of the channels, the number of channels and the number of NVM devices connected to one channel may be variously changed.

Figure 4:
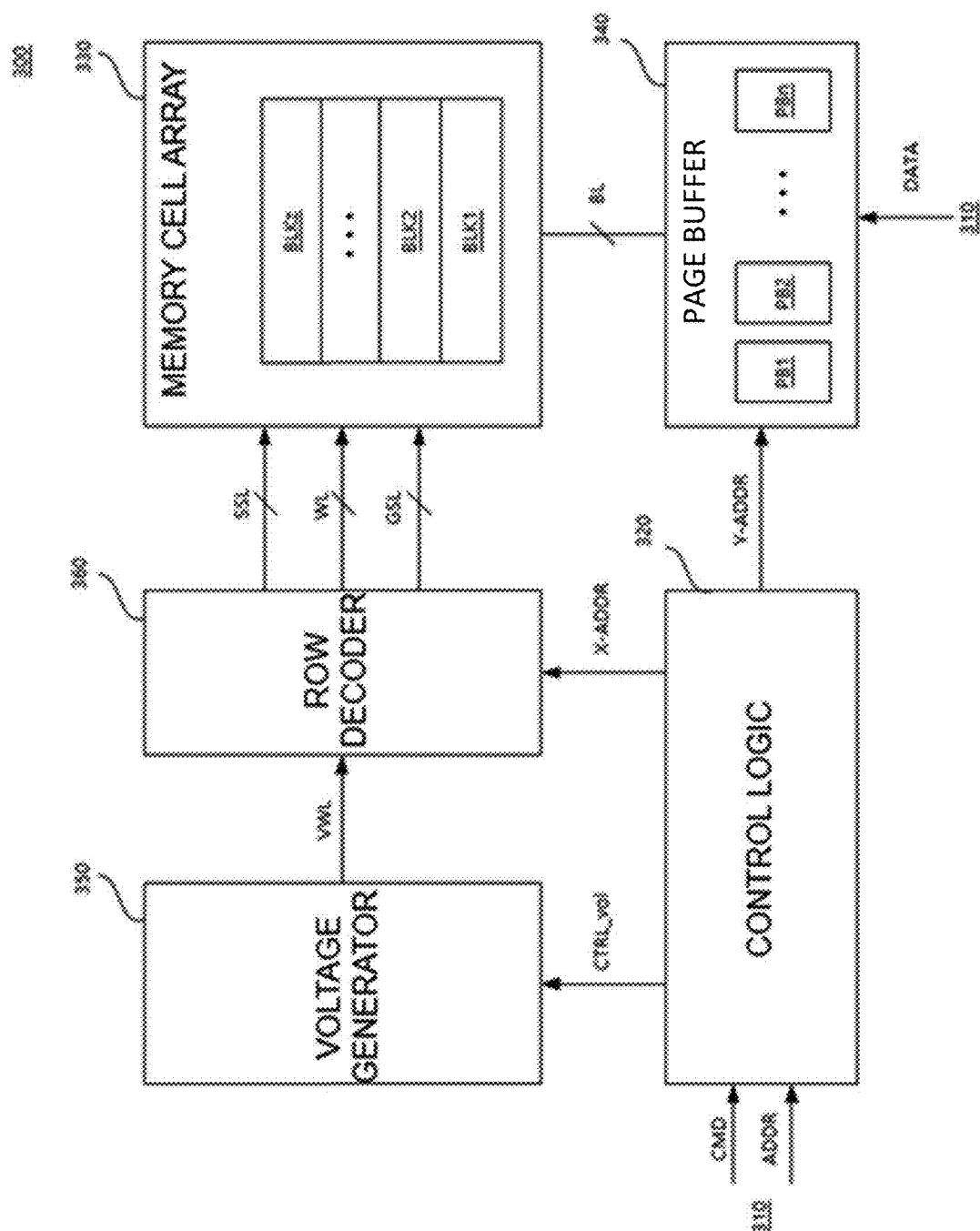
FIG. 4 is a block diagram of a memory device, according to embodiments.

FIG. 4 is a block diagram of a memory device 300 according to an example embodiment. Referring to FIG. 4, the memory device 300 may include a control logic circuitry 320, a memory cell array 330, a page buffer 340, a voltage generator 350, and a row decoder 360. The memory device 300 may further include a memory interface circuitry 310 shown in FIG. 6. In addition, the memory device 300 may further include a column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

Figure 5:
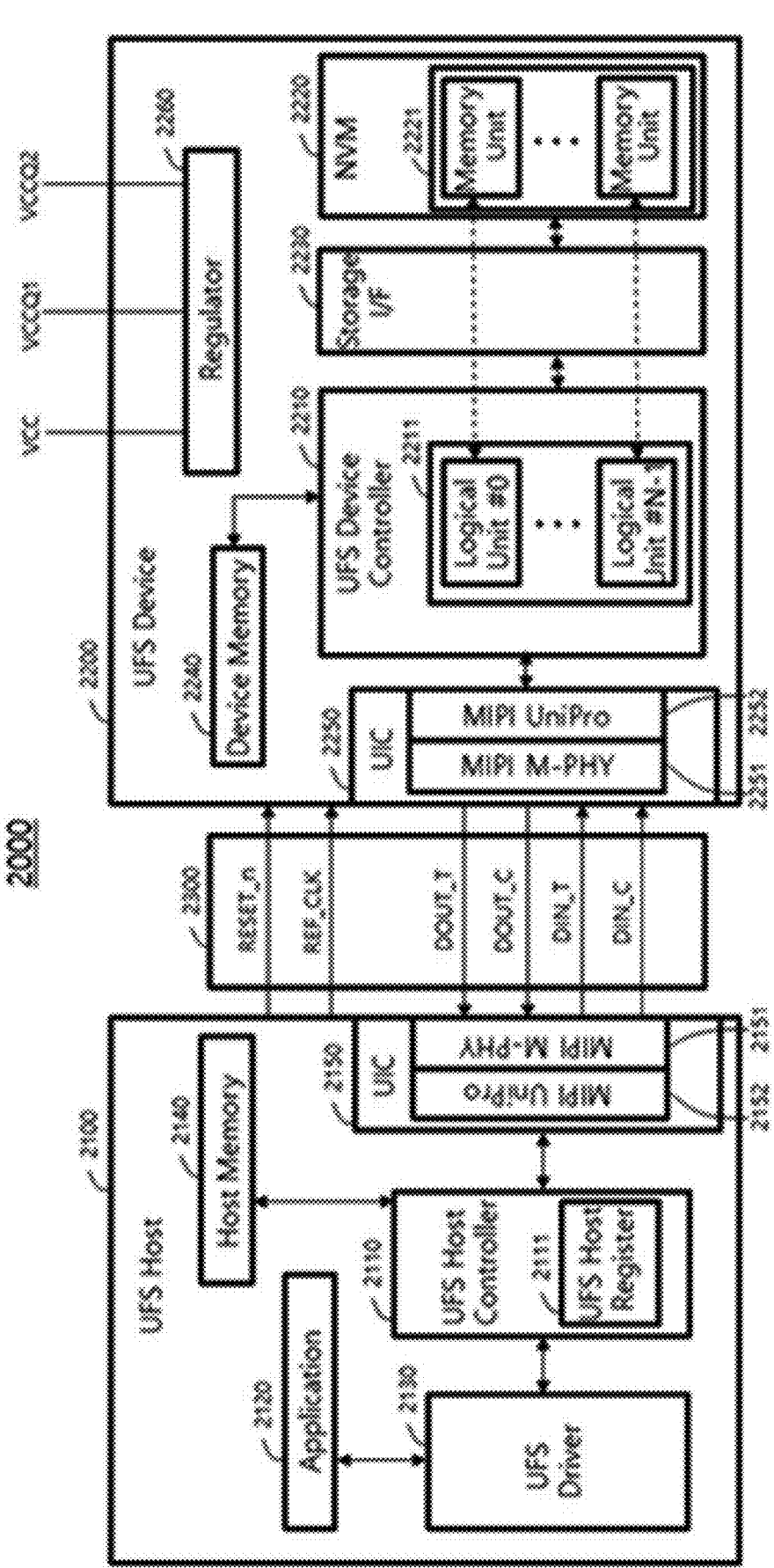
FIG. 5 is a block diagram of a UFS system, according to embodiments.

FIG. 5 is a diagram of a UFS system 2000 according to embodiments. The UFS system 2000 may be a system conforming to a UFS standard announced by Joint Electron Device Engineering Council (JEDEC) and include a UFS host 2100, a UFS device 2200, and a UFS interface 2300. The above description of the system 1000 of FIG. 1 may also be applied to the UFS system 2000 of FIG. 5 within a range that does not conflict with the following description of FIG. 5.

Referring to FIG. 5, the UFS host 2100 may be connected to the UFS device 2200 through the UFS interface 2300. When the main processor 1100 of FIG. 1 is an AP, the UFS host 2100 may be implemented as a portion of the AP. The UFS host controller 2110 and the host memory 2140 may respectively correspond to the controller 1120 of the main processor 1100 and the memories 1200a and 1200b of FIG. 1. The UFS device 2200 may correspond to the storage device 1300a and 1300b of FIG. 1, and a UFS device controller 2210 and an NVM 2220 may respectively correspond to the storage controllers 1310a and 1310b and the NVMs 1320a and 1320b of FIG. 1.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the NVM 2220, a storage interface 2230, a device memory 2240, a UIC layer 2250, and a regulator 2260. The NVM 2220 may include a plurality of memory units 2221. Although each of the memory units 2221 may include a V-NAND flash memory having a 2D structure or a 3D structure, each of the memory units 2221 may include another kind of NVM, such as PRAM and/or RRAM. The UFS device controller 2210 may be connected to the NVM 2220 through the storage interface 2230. The storage interface 2230 may be configured to comply with a standard protocol, such as Toggle or ONFI.

The application 2120 may refer to a program that wants to communicate with the UFS device 2200 to use functions of the UFS device 2200. The application 2120 may transmit input-output requests (IORs) to the UFS driver 2130 for input/output (I/O) operations on the UFS device 2200. The IORs may refer to a data read request, a data storage (or write) request, and/or a data erase (or discard) request, without being limited thereto.

The UFS driver 2130 may manage the UFS host controller 2110 through a UFS-host controller interface (UFS-HCI). The UFS driver 2130 may convert the IOR generated by the application 2120 into a UFS command defined by the UFS standard and transmit the UFS command to the UFS host controller 2110. One IOR may be converted into a plurality of UFS commands. Although the UFS command may basically be defined by an SCSI standard, the UFS command may be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. During the transmission of the UFS command, a UFS host register 2111 of the UFS host controller 2110 may serve as a command queue (CQ).

The UIC layer 2150 on the side of the UFS host 2100 may include a mobile industry processor interface (MIPI) M-PHY 2151 and an MIPI UniPro 2152, and the UIC layer 2250 on the side of the UFS device 2200 may also include an MIPI M-PHY 2251 and an MIPI UniPro 2252.

The UFS interface 2300 may include a line configured to transmit a reference clock signal REF_CLK, a line configured to transmit a hardware reset signal RESET_n for the UFS device 2200, a pair of lines configured to transmit a pair of differential input signals DIN_t and DIN_c, and a pair of lines configured to transmit a pair of differential output signals DOUT_t and DOUT_c.

A frequency of a reference clock signal REF_CLK provided from the UFS host 2100 to the UFS device 2200 may be one of 19.2 MHz, 26 MHz, 38.4 MHz, and 52 MHz, without being limited thereto. The UFS host 2100 may change the frequency of the reference clock signal REF_CLK during an operation, that is, during data transmission/receiving operations between the UFS host 2100 and the UFS device 2200. The UFS device 2200 may generate cock signals having various frequencies from the reference clock signal REF_CLK provided from the UFS host 2100, by using a phase-locked loop (PLL). Also, the UFS host 2100 may set a data rate between the UFS host 2100 and the UFS device 2200 by using the frequency of the reference clock signal REF_CLK. That is, the data rate may be determined depending on the frequency of the reference clock signal REF_CLK.

The UFS interface 2300 may support a plurality of lanes, each of which may be implemented as a pair of differential lines. For example, the UFS interface 2300 may include at least one receiving lane and at least one transmission lane. In FIG. 5, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 5, the number of transmission lanes and the number of receiving lanes may be changed.

The receiving lane and the transmission lane may transmit data based on a serial communication scheme. Full-duplex communications between the UFS host 2100 and the UFS device 2200 may be enabled due to a structure in which the receiving lane is separated from the transmission lane. That is, while receiving data from the UFS host 2100 through the receiving lane, the UFS device 2200 may transmit data to the UFS host 2100 through the transmission lane. In addition, control data (e.g., a command) from the UFS host 2100 to the UFS device 2200 and user data to be stored in or read from the NVM 2220 of the UFS device 2200 by the UFS host 2100 may be transmitted through the same lane. Accordingly, between the UFS host 2100 and the UFS device 2200, there may be no need to further provide a separate lane for data transmission in addition to a pair of receiving lanes and a pair of transmission lanes.

The UFS device controller 2210 of the UFS device 2200 may control all operations of the UFS device 2200. The UFS device controller 2210 may manage the NVM 2220 by using a logical unit (LU) 2211, which is a logical data storage unit. The number of LUs 2211 may be 8, without being limited thereto. The UFS device controller 2210 may include an FTL and convert a logical data address (e.g., a logical block address (LBA)) received from the UFS host 2100 into a physical data address (e.g., a physical block address (PBA)) by using address mapping information of the FTL. A logical block configured to store user data in the UFS system 2000 may have a size in a predetermined range. For example, a minimum size of the logical block may be set to 4 Kbyte.

When a command from the UFS host 2100 is applied through the UIC layer 2250 to the UFS device 2200, the UFS device controller 2210 may perform an operation in response to the command and transmit a completion response to the UFS host 2100 when the operation is completed.

As an example, when the UFS host 2100 intends to store user data in the UFS device 2200, the UFS host 2100 may transmit a data storage command to the UFS device 2200. When a response (a 'ready-to-transfer' response) indicating that the UFS host 2100 is ready to receive user data (ready-to-transfer) is received from the UFS device 2200, the UFS host 2100 may transmit user data to the UFS device 2200. The UFS device controller 2210 may temporarily store the received user data in the device memory 2240 and store the user data, which is temporarily stored in the device memory 2240, at a selected position of the NVM 2220 based on the address mapping information of the FTL.

As another example, when the UFS host 2100 intends to read the user data stored in the UFS device 2200, the UFS host 2100 may transmit a data read command to the UFS device 2200. The UFS device controller 2210, which has received the command, may read the user data from the NVM 2220 based on the data read command and temporarily store the read user data in the device memory 2240. During the read operation, the UFS device controller 2210 may detect and correct an error in the read user data by using an ECC engine embedded therein. More specifically, the ECC engine may generate parity bits for write data to be written to the NVM 2220, and the generated parity bits may be stored in the NVM 2220 along with the write data. During the reading of data from the NVM 2220, the ECC engine may correct an error in read data by using the parity bits read from the NVM 2220 along with the read data, and output error-corrected read data.

In addition, the UFS device controller 2210 may transmit user data, which is temporarily stored in the device memory 2240, to the UFS host 2100. In addition, the UFS device controller 2210 may further include an AES engine. The AES engine may perform at least of an encryption operation and a decryption operation on data transmitted to the UFS device controller 2210 by using a symmetric-key algorithm.

The UFS host 2100 may sequentially store commands, which are to be transmitted to the UFS device 2200, in the UFS host register 2111, which may serve as a common queue, and sequentially transmit the commands to the UFS device 2200. In this case, even while a previously transmitted command is still being processed by the UFS device 2200, that is, even before receiving a notification that the previously transmitted command has been processed by the UFS device 2200, the UFS host 2100 may transmit a next command, which is on standby in the CQ, to the UFS device 2200. Thus, the UFS device 2200 may also receive a next command from the UFS host 2100 during the processing of the previously transmitted command. A maximum number (or queue depth) of commands that may be stored in the CQ may be, for example, 32. Also, the CQ may be implemented as a circular queue in which a start and an end of a command line stored in a queue are indicated by a head pointer and a tail pointer.

Each of the plurality of memory units 2221 may include a memory cell array and a control circuit configured to control an operation of the memory cell array. The memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ, and VCCQ2 may be applied as power supply voltages to the UFS device 2200. The voltage VCC may be a main power supply voltage for the UFS device 2200 and be in a range of 2.4 V to 3.6 V. The voltage VCCQ may be a power supply voltage for supplying a low voltage mainly to the UFS device controller 2210 and be in a range of 1.14 V to 1.26 V. The voltage VCCQ2 may be a power supply voltage for supplying a voltage, which is lower than the voltage VCC and higher than the voltage VCCQ, mainly to an I/O interface, such as the MIPI M-PHY 2251, and be in a range of 1.7 V to 1.95 V. The power supply voltages may be supplied through the regulator 2260 to respective components of the UFS device 2200. The regulator 2260 may be implemented as a set of unit regulators respectively connected to different ones of the power supply voltages described above.

As discussed above, embodiments may relate to efficient BCH decoding with low error correcting capability, which may correct t and (1+1) errors in polar codewords. As discussed above, an error correcting capability of t=2 may be used, however embodiments are not limited thereto. In embodiments, at least some polar codewords from among a plurality of polar codewords, which may be stored for example in a storage device, may be decoded using BCH decoders and not polar decoders, and therefore an overall throughput may be increased. In some embodiments, one or more polar parity may be used for checking or validating the polar frames, and for performing smart chase decoding, examples of which are discussed in greater detail below.

Figure 6A:
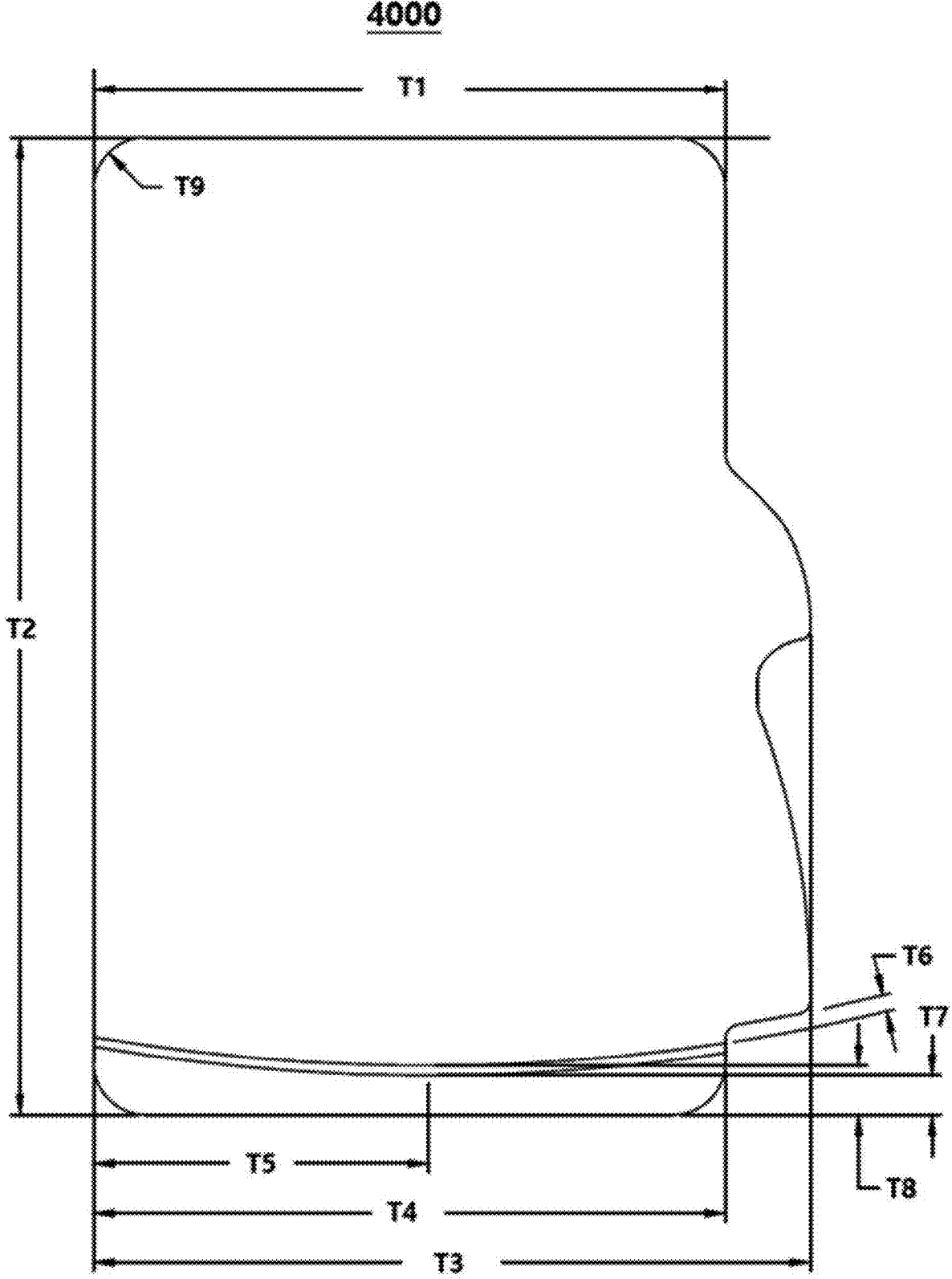
FIGS. 6A to 6C are diagrams of a form factor of a UFS card, according to embodiments.
Figure 6B:
Figure 6B:
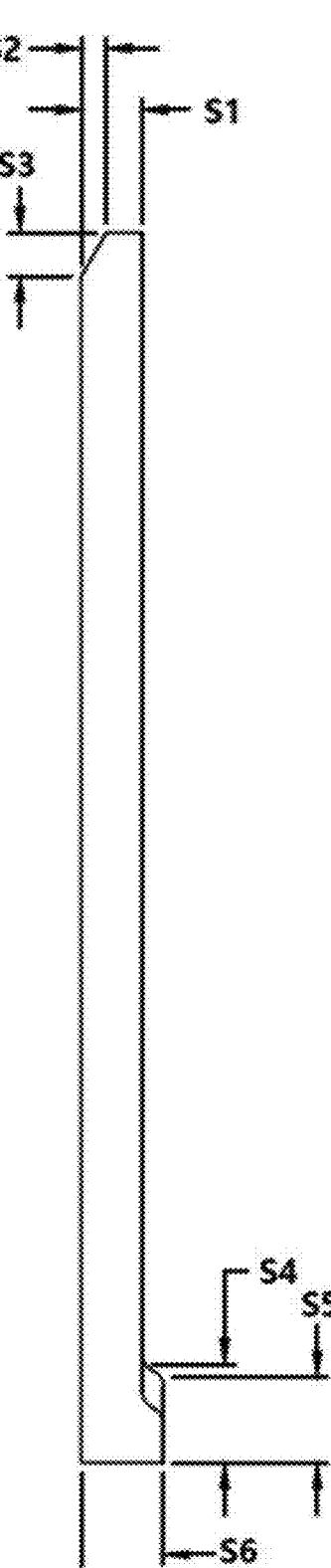
Figure 6C:
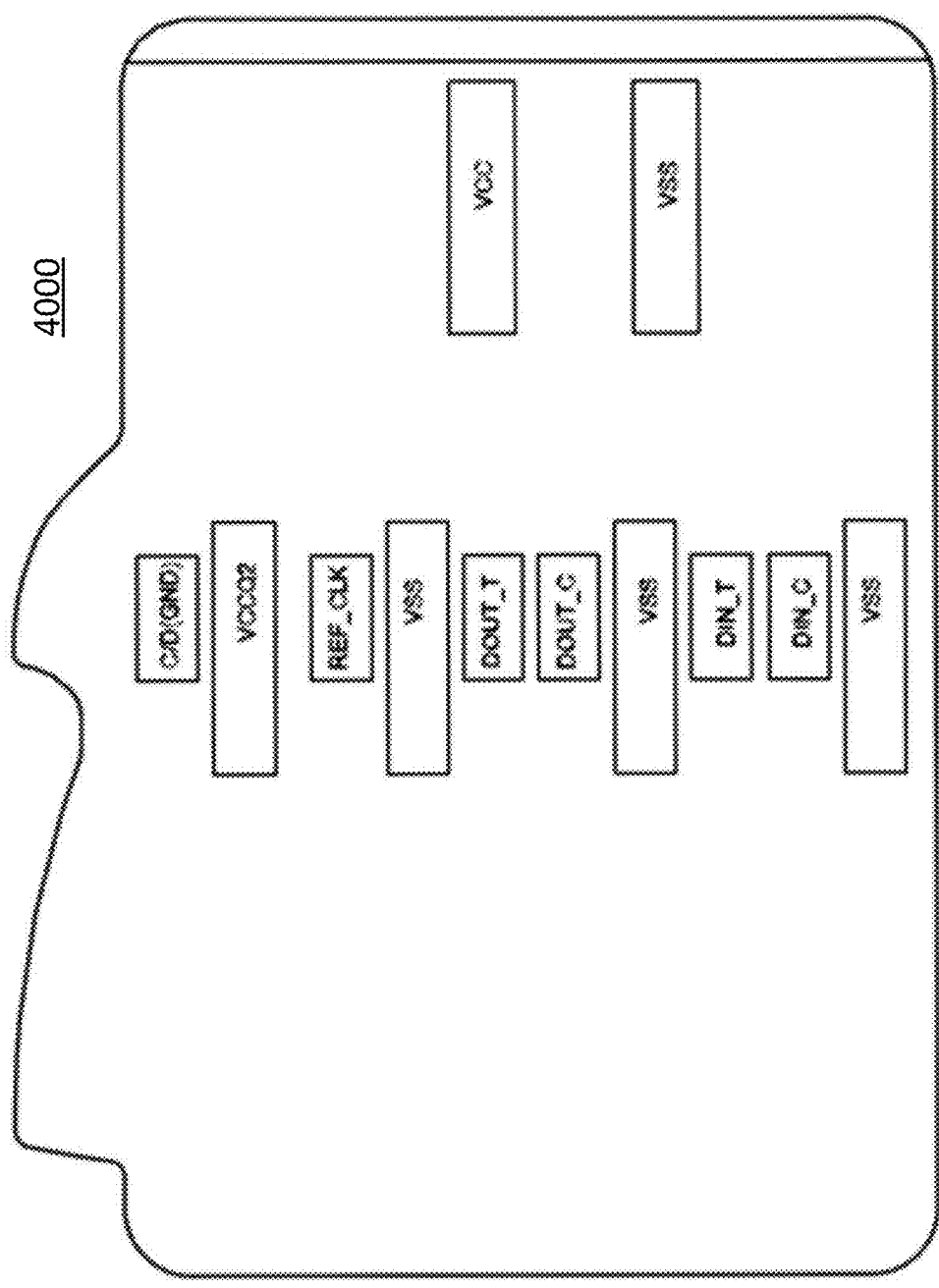

FIGS. 6A to 6C are diagrams of a form factor of a UFS card 4000. When the UFS device 2200 described with reference to FIG. 5 is implemented as the UFS card 4000, an outer appearance of the UFS card 4000 may be as shown in FIGS. 6A to 6C.

FIG. 6A is a top view of the UFS card 4000, according to an example embodiment. Referring to FIG. 6A, it can be seen that the UFS card 4000 entirely follows a shark-shaped design. In FIG. 6A, the UFS card 4000 may have dimensions shown in Table 1 below as an example.

TABLE 1

| Item | Dimension (mm) |
|------|----------------|
| T1 | 9.70 |
| T2 | 15.00 |
| T3 | 11.00 |
| T4 | 9.70 |
| T5 | 5.15 |
| T6 | 0.25 |
| T7 | 0.60 |
| T8 | 0.75 |
| T9 | R0.80 |

FIG. 6B is a side view of the UFS card 4000, according to an example embodiment. In FIG. 6B, the UFS card 4000 may have dimensions shown in Table 2 below as an example.

TABLE 2

| Item | Dimension (mm) |
|------|----------------|
| S1 | 0.74 ± 0.06 |
| S2 | 0.30 |
| S3 | 0.52 |
| S4 | 1.20 |
| S5 | 1.05 |
| S6 | 1.00 |

FIG. 6C is a bottom view of the UFS card 4000, according to an example embodiment. Referring to FIG. 6C, a plurality of pins for electrical contact with a UFS slot may be formed on a bottom surface of the UFS card 4000. Functions of each of the pins will be described below. Based on symmetry between a top surface and the bottom surface of the UFS card 4000, some pieces (e.g., T1 to T5 and T9) of information about the dimensions described with reference to FIG. 6A and Table 1 may also be applied to the bottom view of the UFS card 4000, which is shown in FIG. 6C.

A plurality of pins for an electrical connection with a UFS host may be formed on the bottom surface of the UFS card 4000. Referring to FIG. 6C, a total number of pins may be 12. Each of the pins may have a rectangular shape, and signal names corresponding to the pins may be as shown in FIG. 6C. Specific information about each of the pins will be understood with reference to Table 3 below and the above description presented with reference to FIG. 5.

TABLE 3

| No. | Signal Name | Description | Dimension (mm) |
|---|---|---|---|
| 1 | Vss | Ground (GND) | 3.00 × 0.72 ± 0.05 |
| 2 | DIN_C | Differential input signals | 1.50 × 0.72 ± 0.05 |
| 3 | DIN_T | input from a host to the UFS card 4000 (DIN_C is a negative node, and DIN_T is a positive node) | |
| 4 | Vss | Ground (GND) | 3.00 × 0.72 ± 0.05 |
| 5 | DOUT_C | Differential output signals | 1.50 × 0.72 ± 0.05 |
| 6 | DOUT_T | output from the UFS card 4000 to the host (DOUT_ Cis a negative node, and DOUT_T is a positive node) | |
| 7 | Vss | Ground (GND) | 3.00 × 0.72 ± 0.05 |
| 8 | REF_CLK | Reference clock signal provided from the host to the UFS card 4000 | 1.50 × 0.72 ± 0.05 |
| 9 | VCCQ2 | Power supply voltage provided mainly to a PHY interface or a controller and having a lower value than voltage Vcc | 3.00 × 0.72 ± 0.05 |
| 10 | C/D(GND) | Card detection signal | 1.50 × 0.72 ± 0.05 |
| 11 | Vss | Ground (GND) | 3.00 × 0.80 ± 0.05 |
| 12 | Vcc | Main power supply voltage | |

Figure 7:
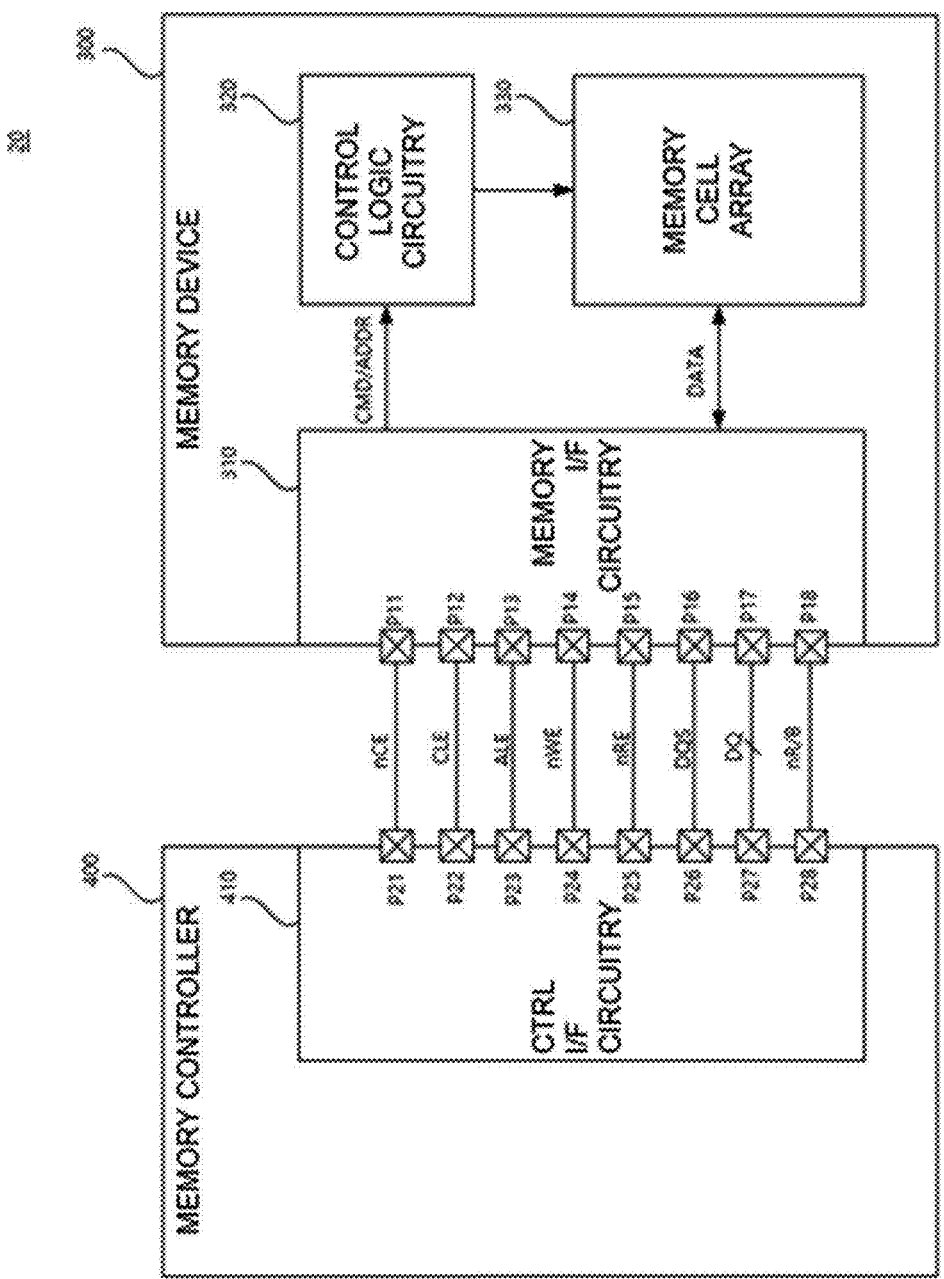
FIG. 7 is a block diagram of a memory system according to embodiments.

FIG. 7 is a block diagram of a memory system 20 according to an embodiment. Referring to FIG. 7, the memory system 20 may include a memory device 300 and a memory controller 400. The memory device 300 may correspond to one of NVM devices NVM11 to NVMmn, which communicate with a memory controller 400 based on one of the plurality of channels CH1 to CHm of FIG. 3. The memory controller 400 may correspond to the storage controller 200 of FIG. 3.

The memory device 300 may include first to eighth pins P11 to P18, a memory interface circuitry 310, a control logic circuitry 320, and a memory cell array 330.

The memory interface circuitry 310 may receive a chip enable signal nCE from the memory controller 400 through the first pin P11. The memory interface circuitry 310 may transmit and receive signals to and from the memory controller 400 through the second to eighth pins P12 to P18 in response to the chip enable signal nCE. For example, when the chip enable signal nCE is in an enable state (e.g., a low level), the memory interface circuitry 310 may transmit and receive signals to and from the memory controller 400 through the second to eighth pins P12 to P18.

The memory interface circuitry 310 may receive a command latch enable signal CLE, an address latch enable signal ALE, and a write enable signal nWE from the memory controller 400 through the second to fourth pins P12 to P14. The memory interface circuitry 310 may receive a data signal DQ from the memory controller 400 through the seventh pin P17 or transmit the data signal DQ to the memory controller 400. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 310 may obtain the command CMD from the data signal DQ, which is received in an enable section (e.g., a high-level state) of the command latch enable signal CLE based on toggle time points of the write enable signal nWE. The memory interface circuitry 310 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 310 may obtain the command CMD or the address ADDR based on toggle time points of the write enable signal nWE.

The memory interface circuitry 310 may receive a read enable signal nRE from the memory controller 400 through the fifth pin P15. The memory interface circuitry 310 may receive a data strobe signal DQS from the memory controller 400 through the sixth pin P16 or transmit the data strobe signal DQS to the memory controller 400.

In a data (DATA) output operation of the memory device 300, the memory interface circuitry 310 may receive the read enable signal nRE, which toggles through the fifth pin P15, before outputting the data DATA. The memory interface circuitry 310 may generate the data strobe signal DQS, which toggles based on the toggling of the read enable signal nRE. For example, the memory interface circuitry 310 may generate a data strobe signal DQS, which starts toggling after a predetermined delay (e.g., tDQSRE), based on a toggling start time of the read enable signal nRE. The memory interface circuitry 310 may transmit the data signal DQ including the data DATA based on a toggle time point of the data strobe signal DQS. Thus, the data DATA may be aligned with the toggle time point of the data strobe signal DQS and transmitted to the memory controller 400.

In a data (DATA) input operation of the memory device 300, when the data signal DQ including the data DATA is received from the memory controller 400, the memory interface circuitry 310 may receive the data strobe signal DQS, which toggles, along with the data DATA from the memory controller 400. The memory interface circuitry 310 may obtain the data DATA from the data signal DQ based on toggle time points of the data strobe signal DQS. For example, the memory interface circuitry 310 may sample the data signal DQ at rising and falling edges of the data strobe signal DQS and obtain the data DATA.

The memory interface circuitry 310 may transmit a ready/busy output signal nR/B to the memory controller 400 through the eighth pin P18. The memory interface circuitry 310 may transmit state information of the memory device 300 through the ready/busy output signal nR/B to the memory controller 400. When the memory device 300 is in a busy state (i.e., when operations are being performed in the memory device 300), the memory interface circuitry 310 may transmit a ready/busy output signal nR/B indicating the busy state to the memory controller 400. When the memory device 300 is in a ready state (i.e., when operations are not performed or completed in the memory device 300), the memory interface circuitry 310 may transmit a ready/busy output signal nR/B indicating the ready state to the memory controller 400. For example, while the memory device 300 is reading data DATA from the memory cell array 330 in response to a page read command, the memory interface circuitry 310 may transmit a ready/busy output signal nR/B indicating a busy state (e.g., a low level) to the memory controller 400. For example, while the memory device 300 is programming data DATA to the memory cell array 330 in response to a program command, the memory interface circuitry 310 may transmit a ready/busy output signal nR/B indicating the busy state to the memory controller 400.

The control logic circuitry 320 may control all operations of the memory device 300. The control logic circuitry 320 may receive the command/address CMD/ADDR obtained from the memory interface circuitry 310. The control logic circuitry 320 may generate control signals for controlling other components of the memory device 300 in response to the received command/address CMD/ADDR. For example, the control logic circuitry 320 may generate various control signals for programming data DATA to the memory cell array 330 or reading the data DATA from the memory cell array 330.

The memory cell array 330 may store the data DATA obtained from the memory interface circuitry 310, via the control of the control logic circuitry 320. The memory cell array 330 may output the stored data DATA to the memory interface circuitry 310 via the control of the control logic circuitry 320.

The memory cell array 330 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 400 may include first to eighth pins P21 to P28 and a controller interface circuitry 410. The first to eighth pins P21 to P28 may respectively correspond to the first to eighth pins P11 to P18 of the memory device 300.

The controller interface circuitry 410 may transmit a chip enable signal nCE to the memory device 300 through the first pin P21. The controller interface circuitry 410 may transmit and receive signals to and from the memory device 300, which is selected by the chip enable signal nCE, through the second to eighth pins P22 to P28.

The controller interface circuitry 410 may transmit the command latch enable signal CLE, the address latch enable signal ALE, and the write enable signal nWE to the memory device 300 through the second to fourth pins P22 to P24. The controller interface circuitry 410 may transmit or receive the data signal DQ to and from the memory device 300 through the seventh pin P27.

The controller interface circuitry 410 may transmit the data signal DQ including the command CMD or the address ADDR to the memory device 300 along with the write enable signal nWE, which toggles. The controller interface circuitry 410 may transmit the data signal DQ including the command CMD to the memory device 300 by transmitting a command latch enable signal CLE having an enable state. Also, the controller interface circuitry 410 may transmit the data signal DQ including the address ADDR to the memory device 300 by transmitting an address latch enable signal ALE having an enable state.

The controller interface circuitry 410 may transmit the read enable signal nRE to the memory device 300 through the fifth pin P25. The controller interface circuitry 410 may receive or transmit the data strobe signal DQS from or to the memory device 300 through the sixth pin P26.

In a data (DATA) output operation of the memory device 300, the controller interface circuitry 410 may generate a read enable signal nRE, which toggles, and transmit the read enable signal nRE to the memory device 300. For example, before outputting data DATA, the controller interface circuitry 410 may generate a read enable signal nRE, which is changed from a static state (e.g., a high level or a low level) to a toggling state. Thus, the memory device 300 may generate a data strobe signal DQS, which toggles, based on the read enable signal nRE. The controller interface circuitry 410 may receive the data signal DQ including the data DATA along with the data strobe signal DQS, which toggles, from the memory device 300. The controller interface circuitry 410 may obtain the data DATA from the data signal DQ based on a toggle time point of the data strobe signal DQS.

In a data (DATA) input operation of the memory device 300, the controller interface circuitry 410 may generate a data strobe signal DQS, which toggles. For example, before transmitting data DATA, the controller interface circuitry 410 may generate a data strobe signal DQS, which is changed from a static state (e.g., a high level or a low level) to a toggling state. The controller interface circuitry 410 may transmit the data signal DQ including the data DATA to the memory device 300 based on toggle time points of the data strobe signal DQS.

The controller interface circuitry 410 may receive a ready/busy output signal nR/B from the memory device 300 through the eighth pin P28. The controller interface circuitry 410 may determine state information of the memory device 300 based on the ready/busy output signal nR/B.

Figure 8:
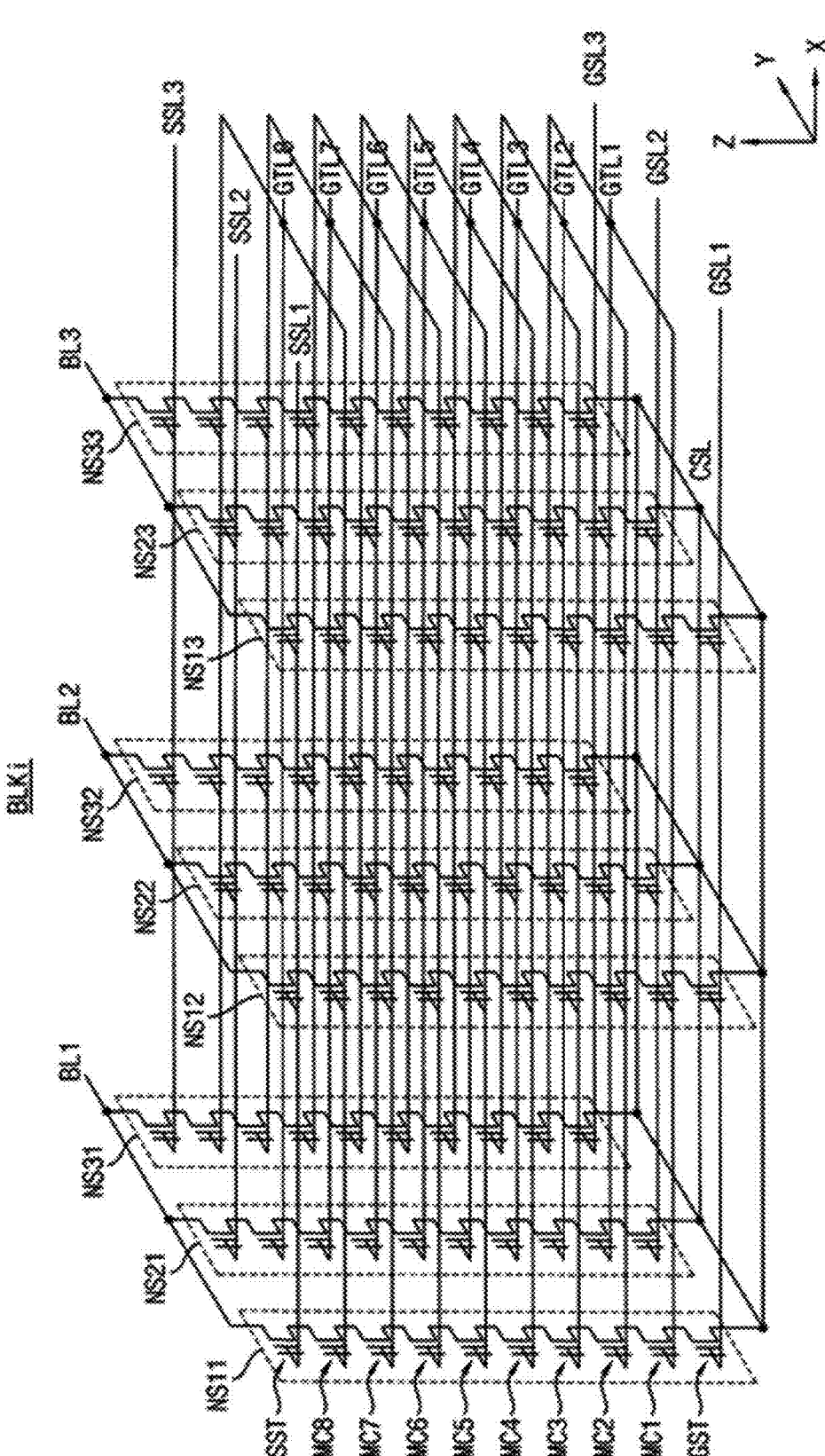
FIG. 8 is a diagram of a 3D V-NAND structure applicable to a UFS device according to an embodiment.

FIG. 8 is a diagram of a 3D V-NAND structure applicable to a UFS device according to an embodiment. When a storage module of the UFS device is implemented as a 3D V-NAND flash memory, each of a plurality of memory blocks included in the storage module may be represented by an equivalent circuit shown in FIG. 8.

A memory block BLKi shown in FIG. 8 may refer to a 3D memory block having a 3D structure formed on a substrate. For example, a plurality of memory NAND strings included in the memory block BLKi may be formed in a vertical direction to the substrate.

Referring to FIG. 8, the memory block BLKi may include a plurality of memory NAND strings (e.g., NS11 to NS33), which are connected between bit lines BL1, BL2, and BL3 and a common source line CSL. Each of the memory NAND strings NS11 to NS33 may include a string selection transistor SST, a plurality of memory cells (e.g., MC1, MC2, . . . , and MC8), and a ground selection transistor GST. Each of the memory NAND strings NS11 to NS33 is illustrated as including eight memory cells MC1, MC2, . . . , and MC8 in FIG. 8, without being limited thereto.

The string selection transistor SST may be connected to string selection lines SSL1, SSL2, and SSL3 corresponding thereto. Each of the memory cells MC1, MC2, . . . , and MC8 may be connected to a corresponding one of gate lines GTL1, GTL2, . . . , and GTL8. The gate lines GTL1, GTL2, . . . , and GTL8 may respectively correspond to word lines, and some of the gate lines GTL1, GTL2, . . . , and GTL8 may correspond to dummy word lines. The ground selection transistor GST may be connected to ground selection lines GSL1, GSL2, and GSL3 corresponding thereto. The string selection transistor SST may be connected to the bit lines BL1, BL2, and BL3 corresponding thereto, and the ground selection transistor GST may be connected to the common source line CSL.

Word lines (e.g., WL1) at the same level may be connected in common, and the ground selection lines GSL1, GSL2, and GSL3 and the string selection lines SSL1, SSL2, and SSL3 may be separated from each other. FIG. 8 illustrates a case in which a memory block BLK is connected to eight gate lines GTL1, GTL2, . . . , and GTL8 and three bit lines BL1, BL2, and BL3, without being limited thereto.

Figure 9:
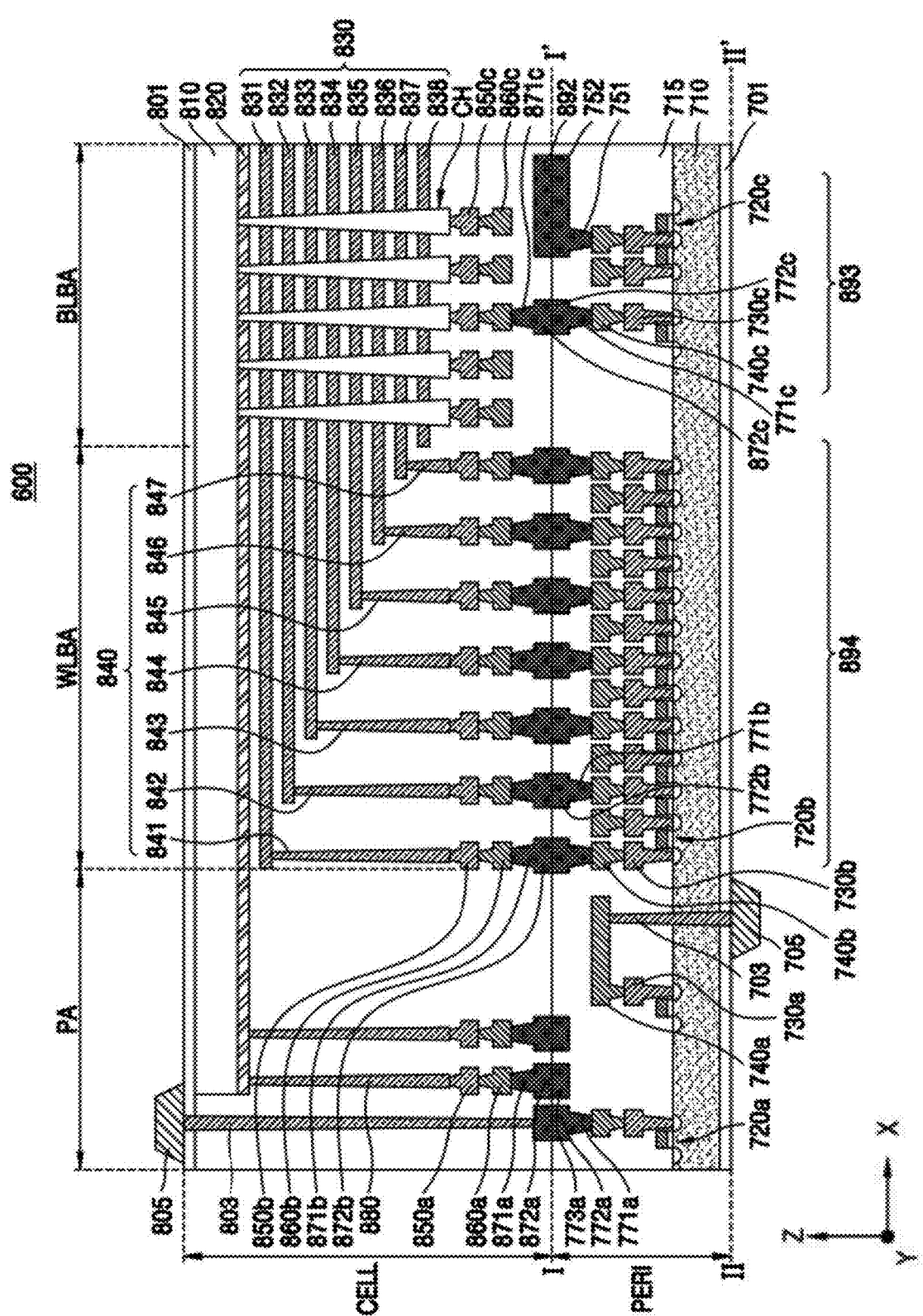
FIG. 9 is a diagram illustrating a memory device according to embodiments.

FIG. 9 is a diagram illustrating a memory device 600 according to another example embodiment.

Referring to FIG. 9, a memory device 600 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 600 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high electrical resistivity, and the second metal layers 740a, 740b, and 740c may be formed of copper having relatively low electrical resistivity.

In an example embodiment illustrate in FIG. 9, although only the first metal layers 730a, 730b, and 730c and the second metal layers 740a, 740b, and 740c are shown and described, the example embodiment is not limited thereto, and one or more additional metal layers may be further formed on the second metal layers 740a, 740b, and 740c. At least a portion of the one or more additional metal layers formed on the second metal layers 740a, 740b, and 740c may be formed of aluminum or the like having a lower electrical resistivity than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically bonded to upper bonding metals 871b and 872b of the cell region CELL. The lower bonding metals 771b and 772b and the upper bonding metals 871b and 872b may be formed of aluminum, copper, tungsten, or the like. Further, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction (a Z-axis direction), perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a first direction (a Y-axis direction), parallel to the upper surface of the second substrate 810.

In an example embodiment illustrated in FIG. 9, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. The bit line 860c may be connected to upper bonding metals 871c and 872c in the cell region CELL, and the upper bonding metals 871c and 872c may be connected to lower bonding metals 771c and 772c connected to the circuit elements 720c of the page buffer 893. In an example embodiment, a program operation may be executed based on a page unit as write data of the page-unit is stored in the page buffer 893, and a read operation may be executed based on a sub-page unit as read data of the sub-page unit is stored in the page buffer 893. Also, in the program operation and the read operation, units of data transmitted through bit lines may be different from each other.

In the word line bonding area WLBA, the plurality of word lines 830 may extend in a second direction (an X-axis direction), parallel to the upper surface of the second substrate 810 and perpendicular to the first direction, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the peripheral circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b forming a row decoder 894 in the peripheral circuit region PERI. In an example embodiment, operating voltages of the circuit elements 720b of the row decoder 894 may be different than operating voltages of the circuit elements 720c forming the page buffer 893. For example, operating voltages of the circuit elements 720c forming the page buffer 893 may be greater than operating voltages of the circuit elements 720b forming the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 9, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 9, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803. In the example embodiment, the second input-output pad 805 is electrically connected to a circuit element 720a.

According to embodiments, the second substrate 810 and the common source line 820 may not be disposed in an area in which the second input-output contact plug 803 is disposed. Also, the second input-output pad 805 may not overlap the word lines 830 in the third direction (the Z-axis direction). Referring to FIG. 9, the second input-output contact plug 303 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 600 may include only the first input-output pad 705 disposed on the first substrate 710 or the second input-output pad 805 disposed on the second substrate 810. Alternatively, the memory device 600 may include both the first input-output pad 705 and the second input-output pad 805.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 600 may include a lower metal pattern 773a, corresponding to an upper metal pattern 872a formed in an uppermost metal layer of the cell region CELL, and having the same cross-sectional shape as the upper metal pattern 872a of the cell region CELL so as to be connected to each other, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern 872a, corresponding to the lower metal pattern 773a formed in an uppermost metal layer of the peripheral circuit region PERI, and having the same shape as a lower metal pattern 773a of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu-to-Cu bonding.

Further, in the bit line bonding area BLBA, an upper metal pattern 892, corresponding to a lower metal pattern 752 formed in the uppermost metal layer of the peripheral circuit region PERI, and having the same cross-sectional shape as the lower metal pattern 752 of the peripheral circuit region PERI, may be formed in an uppermost metal layer of the cell region CELL. A contact may not be formed on the upper metal pattern 892 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

As discussed above, a storage device such as the SSD 200 may include an NVM 220 such as a NAND flash memory for storing data, and may also a VM 230 such as a DRAM for caching or buffering the data as it is written to, or read from, the NVM 220. If a power supply to the storage device is interrupted while data is stored in the VM 230, and before the data is written to the NVM 220, the data may be corrupted or lost. Therefore, some storage devices which include VMs may also include a backup power supply, which may be implemented using capacitors which charged while power is supplied to the storage device. Upon detecting an abrupt loss of power, the storage device may operate by discharging the capacitors to provide enough current to flush data from the VM to the NVM.

In some embodiments, the number of programming pulses may be reduced by treating the memory cells in each word line of the NVM 220 as SLCs, in which for example each cell may hold a single bit. The data stored in the VM 230 may be written, word line by word line, into designated blocks of the NVM 220. In each word line, programming pulses may be applied to approximately half of the memory cells to modify the information bits stored therein. For example, in some embodiments, the programming pulses may be used to modify the information bits stored in the memory cells from an erase level (e.g., a voltage representing a value of one) to a first level (e.g., a voltage representing a value of zero), which may be a voltage level one near a target voltage $V_t$. The writing operation for each word line may end once the number N of unprogrammed cells is reduced below a specific number $N_{full}$. In embodiments, unprogrammed cells may refer to memory cells having threshold voltages which should exceed the target voltage $V_t$, but which do not exceed the target voltage $V_t$.

Embodiments may relate to a process for further decreasing the data writing time. For example, embodiments may relate to process for programming or writing data during power loss protection mode which may include two stages.

First, each word line may be partially programmed such that the number N of unprogrammed cells is decreased to below a number $N_{part}$, which may be for example larger than the number $N_{full}$ discussed above. Second, when the number N of unprogrammed cells reaches the number $N_{part}$, one of two possible paths may be selected:

Path A: Continue applying additional programming pulses until the number N of unprogrammed cells reaches the number $N_{full}$ Path B: Stop programming the word line, store the information bits from cells with threshold voltage below the target voltage $V_t$, and write these information bits to a subsequent word line.

In embodiments, a machine-learning-based algorithm may be used to determine the cost of each path, and to choose an optimal course of action that minimizes the overall writing time. In embodiments, if the second path (e.g., Path B) is selected, the data which is intended to be written to the unprogrammed cells (e.g., the memory cells included in the word line which have a threshold voltage below $V_t$), which may be referred to as remainder data, may be compressed and stored along with previous remainder data from previous word lines. In embodiments, the compressed remainder data may be stored in a buffer, for example one or more of the buffer memory 216 and the VM 230. The remainder data may correspond to a sparse vector, and therefore may be efficiently compressed, for example using a Huffman compression algorithm with a fixed table. When the compressed remainder data from the word line, as well as previous word lines, exceeds the length of a single word line, the compressed remainder data may be written to the next word line before the next batch of data is processed. In embodiments, the remainder data may be written by applying programming pulses until the number N of unprogrammed cells reaches the number $N_{full}$. After the compressed remainder data is written, the next batch of data may be written to the next word line. An example of the programming process described above is provided below with respect to FIG. 10.

Figure 10:
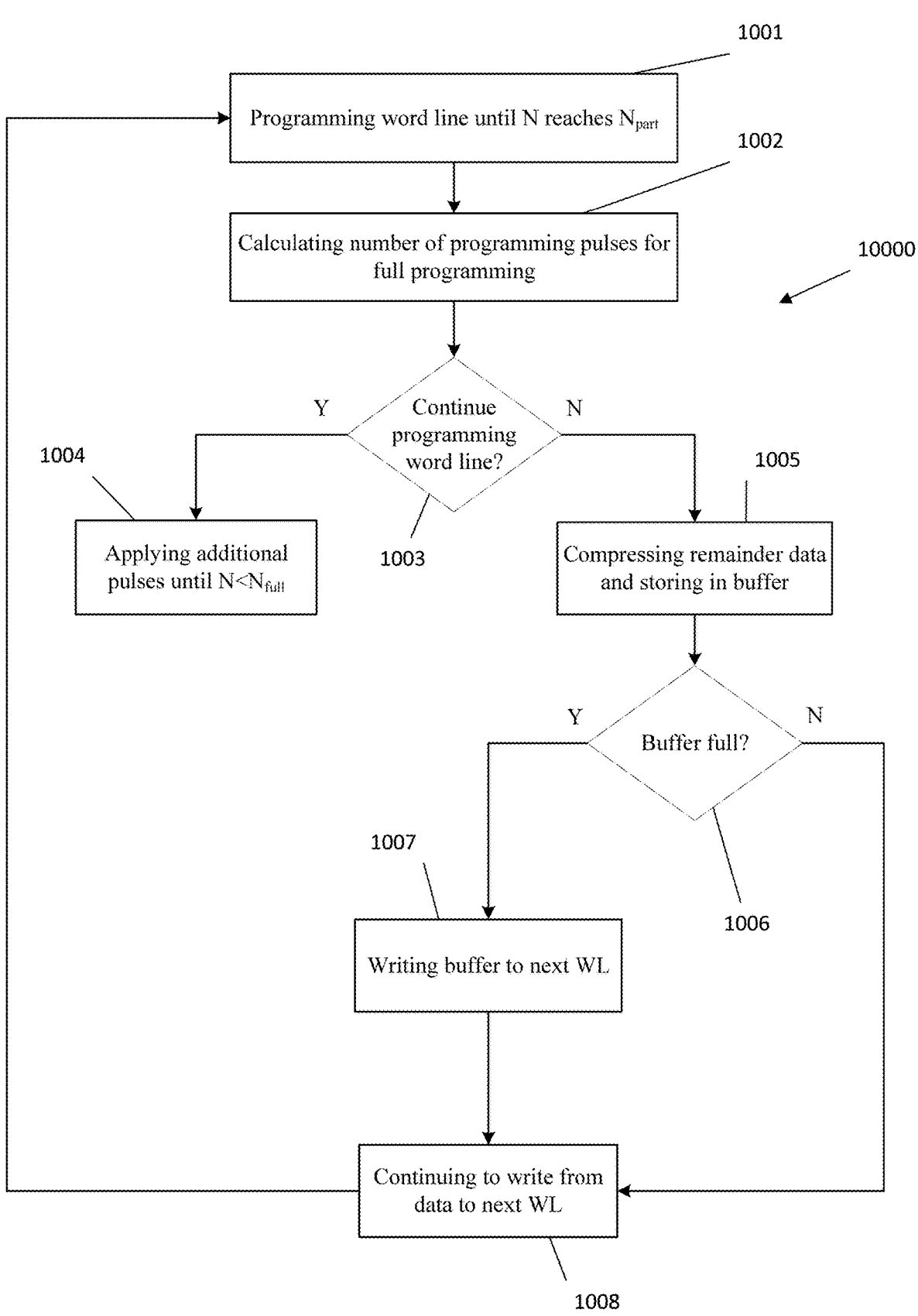
FIG. 10 is a flowchart of a process for controlling a storage system, according to embodiments.

FIG. 10 is a flowchart of a process 100000 of controlling a storage device, according to embodiments. In some implementations, one or more process blocks of FIG. 10 may be performed by any of the elements discussed above, for example one or more of the storage device 200 and any of the elements included therein, for example the storage controller 210, the NVM 220, and the VM 230.

As shown in FIG. 10, at operation 1001 the process 10000 may include programming or writing a word to a word line until the number N of unprogrammed cells included in the word line reaches or drops below the threshold number $N_{part}$.

As further shown in FIG. 10, at operation 1002 the process 10000 may include calculating a number of programming pulses needed to achieve full programming of the word line. For example, in some embodiments, operation 1002 may include calculating an expected number of programming pulses for reducing the number N of unprogrammed cells from the threshold number $N_{part}$ to the threshold number $N_{full}$.

As further shown in FIG. 10, at operation 1003 the process 10000 may include determining whether to continue programming the word line. In embodiments, this determination may be made by calculating an expected number of programming pulses for proceeding according to Path A and Path B discussed above. Examples of performing this determination according to embodiments are discussed in greater detail below.

Based on determining to continue programming the word line (Y at operation 1003), the process 10000 may proceed to operation 1004, which may include applying additional programming pulses to the word line until the number N of unprogrammed cells reaches or drops below a threshold number $N_{full}$.

Based on determining not to continue programming the word line (N at operation 1003), the process 10000 may process to operation 1005, which may include compressing the remainder data, which may refer to data intended to be written to the unprogrammed cells, and storing the compressed remainder data in a buffer.

As further shown in FIG. 10, at operation 1006 the process 10000 may include determining whether the buffer is full. In embodiments, the buffer may be used to store compressed remainder data for the current word line and also compressed remainder data from previous word lines. In embodiments, the buffer may be determined to be full based on an amount of the compressed remainder data being greater than or equal to a maximum amount of data which can be written to a word line.

Based on determining that the buffer is not full (N at operation 1006), the process 10000 may proceed to operation 1008, which may include continuing to write data to a next word line.

Based on determining that the buffer is full (Y at operation 1006), the process 10000 may proceed to operation 1007, which may include writing the compressed remainder data stored in the buffer to a next word line, and may then proceed to operation 1008.

In embodiments, operation 1004 may correspond to Path A discussed above, and operations 1005, 1006, and 1007 may correspond to Path B discussed above, however embodiments are not limited thereto.

As discussed above, embodiments may relate to predicting a difference between a number of pulses which may be used to partially program the word line, and a number of pulses which may be used to fully program the word line. For example, based on a current voltage level which is supplied by the backup power supply, a number $m_{part}$ of programming pulses may cause the number N of unprogrammed cells to reach or drop below the number $N_{part}$ and a number $m_{full}$ of programming pulses may cause the number N of unprogrammed cells to reach or drop below the number $N_{full}$.

In some embodiments, the voltage level supplied by the backup power supply may decrease over time, and this decreasing voltage level may result in a non-monotonous change $m_{full}-m_{part}$. Therefore, there may be several voltage windows in which it may be beneficial to program a word line only partially, and compensate for an increased error rate, for example an increased bit error rate (BER) caused by the partial programming by writing additional information, for example the compressed remainder information, to a different word line. However, at other voltage levels, such a writing process may result in an increased number of programming pulses. Therefore, embodiments may provide a real-time prediction of the expected gain in terms of the number of programming pulses corresponding to the partial writing scheme in comparison with the full writing scheme (e.g., the expected benefit of Path B in comparison with Path A), without any knowledge of the actual programming voltage. According to embodiments, this prediction may be performed using a machine learning model, an example of which is described below with respect to FIG. 11.

Figure 11:
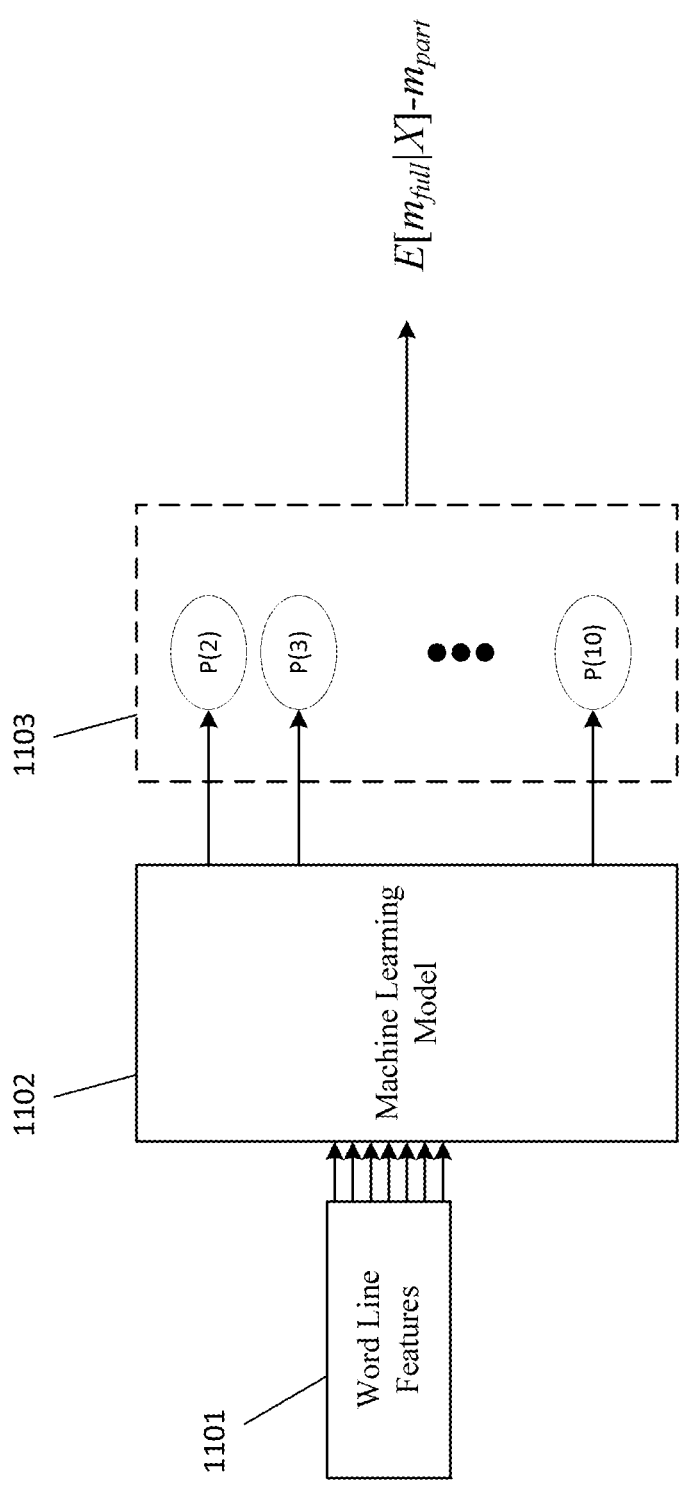
FIG. 11 is a diagram illustrating an example of a machine learning model, according to embodiments.

FIG. 11 is a diagram illustrating an example of a machine learning model, according to embodiments. In some embodiments, the machine learning model 1102 may include a neural network, for example a multi-class neural network. In embodiments, the output of the machine learning model 1102 may be a vector 1103 of a predicted probability density for the number of programming pulses needed to fully program the word line (e.g., the number $m_{full}$ of programming pulses to reduce the number N of unprogrammed cells to the number $N_{full}$). In embodiments, the probability density may be expressed according to Equation 1 below:

$$F_w(X) = P(\text{number of pulses} = m|X) \qquad \text{(Equation 1)}$$

In Equation 1 above, X may denote a vector 1101 of measured and known word line features of the word line, and $F_w$ may denote a function with a set of parameters w. According to embodiments, the vector 1101 of word line features (e.g., the vector X) may include or indicate one or more features such as the number N of unprogrammed cells (or a percentage of unprogrammed cells) which remain after the number N reaches or drops below the number $N_{part}$, the number $m_{part}$ of programming pulses applied to cause the number N of unprogrammed cells to reach or drop below the number $N_{part}$, and an index or other identifier corresponding to or associated with the word line. In addition, the input may include non-linear combinations of the three parameters.

For example, in some embodiments there may be five different combinations of word line features included in the vector 1101. The number of weights or parameters w may depend on the length of the output vector 1103, which may be denoted M. Accordingly, for each pulse number $m \in M$, there may be 5+1 weights (e.g., five weights corresponding to the word line features, and an additional weight corresponding to a bias term). Therefore, in total, there may be 6M weights, but embodiments are not limited thereto. Although the output vector 1103 may be of any arbitrary length, in some embodiments the number of pulses may be restricted to the range $2 \leq m \leq 11$. However, embodiments are not limited thereto.

After the criterion for partial programming is fulfilled (e.g., after the number N of unprogrammed cells drops below the number $N_{part}$, the vector 1101 of word line features (e.g., the vector X) may be provided to the machine learning model 1102, which may return a the vector 1103 of the predicted probability density of the number of pulses required for complete programming (e.g., a number $m_{full}$ of programming pulses which may cause the number N of unprogrammed cells to reach or drop below the number $N_{full}$).

In embodiments, the expected number of pulses $E[m_{full}|X]$ for fully programming the word line may be determined based on the probability density. Accordingly, the expected cost Cost of continuing to program the word line (e.g., the expected number of pulses for reducing the number N of unprogrammed cells from $N_{part}$ to $N_{full}$), may be determined according to Equation 2 below:

$$\text{Cost}_A = E[m_{full}|X] - m_{part} \qquad \text{Equation 2}$$

In embodiments, it may be assumed that the expected number of pulses $E[m_{full}|X]$ for fully programming the word line may be similar across word lines. Therefore, the expected cost Cost$_B$ of writing the remainder data to a different word line may be estimated from the product of the expected compression ratio C(N) and the expected number of pulses $E[m_{full}|X]$ for fully programming the word line, as shown in Equation 3 below:

$$\text{Cost}_B = C(N) * E[m_{full}|X] \qquad \text{Equation 3}$$

The decision about how to proceed (e.g., the decision between Path A and Path B) may be made by comparing the estimated Cost, and the estimated Cost$_B$. Based on determining that the estimated cost Cost$_A$ is less than or equal to the estimated Cost$_B$, the programming of the word line may continue by applying additional programming pulses to the word line. However, based on determining that the estimated cost Cost$_A$ is greater than the estimated cost Cost$_B$, the remainder data corresponding to the unprogrammed cells may be compressed and stored in a buffer. Then, the programming operation may continue by writing the next batch of data to a new word line, unless the storage buffer is full. If the storage buffer is full, or for example if the amount of compressed remainder data is greater than or equal to the maximum amount of data which can be written to a word line, the data from the buffer may be written to the next word line. In embodiments, the reading scheme for the data may be modified to accommodate the changes to the new structure of data storage.

According to some embodiments, for a linear drop in the voltage level as a function of the number of pulses applied using the backup power supply, the amount of data which may be saved after an abrupt loss of power may be increased by approximately 40%, or the same amount of data may be written with approximately 30% fewer capacitors connected in series. However, embodiments are not limited thereto.

Figure 12A:
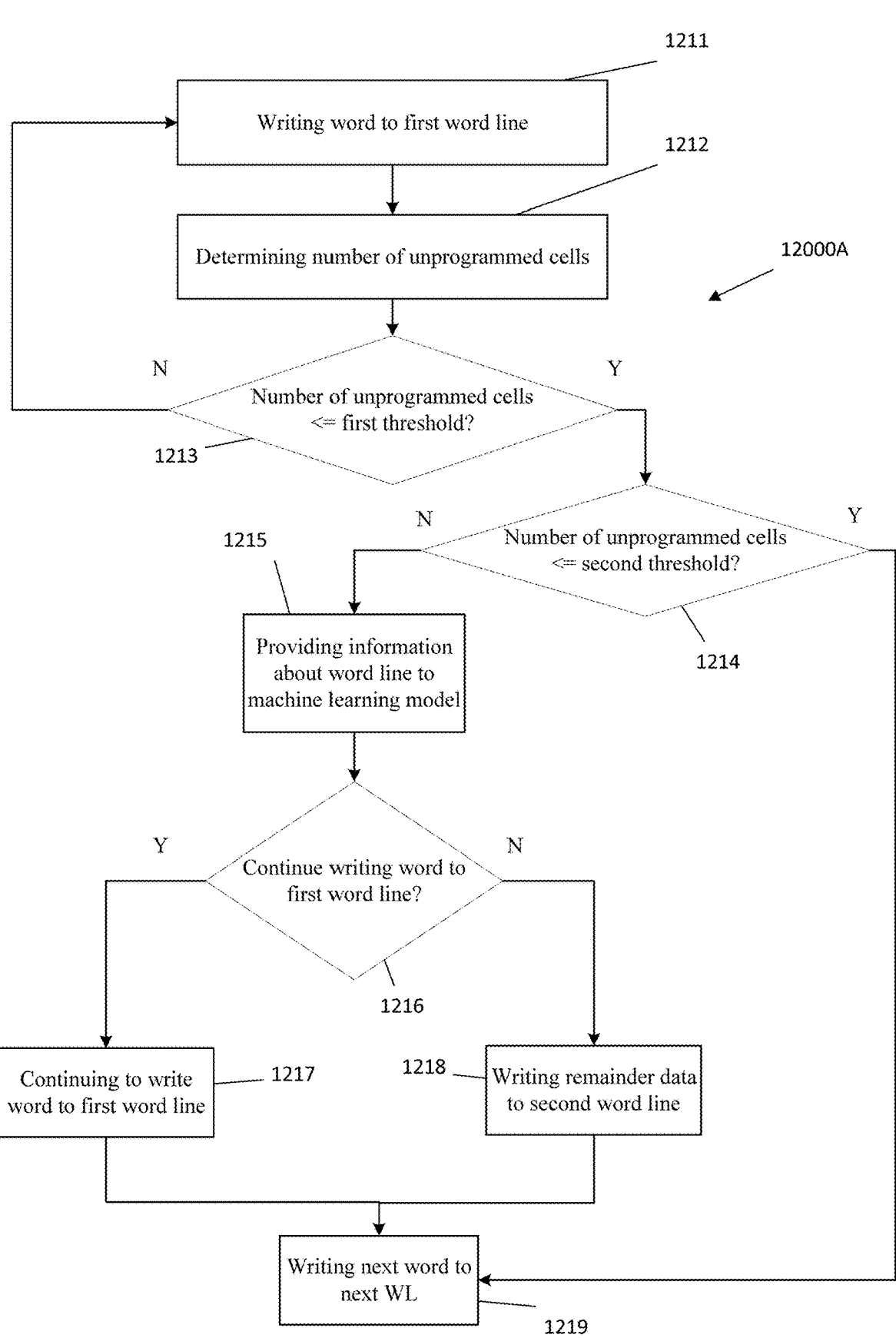

FIG. 12A is a flowchart of a process 12000A of controlling a storage device, according to embodiments. In some implementations, one or more process blocks of FIG. 12A may be performed by any of the elements discussed above, for example one or more of the storage device 200 and any of the elements included therein, for example the storage controller 210, the NVM 220, and the VM 230.

As shown in FIG. 12A, at operation 1211 the process 12000A may include writing a word to a first word line from among a plurality of word lines. In embodiments, the word may include data stored in a VM which is to be written to an NVM based on an abrupt loss of power being detected by a storage device including the VM and the NVM. In embodiments, the word line may be included in the NVM. In embodiments, the NVM may correspond to the NVM 220 discussed above, the VM may correspond to VM 230, and the storage device may correspond to the storage device 200 discussed above. In embodiments, writing the word to the first word line may include applying a first number of programming pulses to the first word line.

As further shown in FIG. 12A, at operation 1212 the process 12000A may include determining a number of unprogrammed cells included in the word line. In embodiments, the unprogrammed cells may be memory cells which have threshold voltages which should exceed the target voltage $V_t$ based on the word, but which do not actually exceed the target voltage $V_t$. In embodiments, the data which is intended to be written to the unprogrammed cells may be referred to as remainder data.

As further shown in FIG. 12A, at operation 1213 the process 12000A may include determining whether the number of unprogrammed cells is less than or equal to a first threshold number. In embodiments, the number of unprogrammed cells may correspond to the number N, and the first threshold number may correspond to the number $N_{part}$.

Based on determining that the number of unprogrammed cells is not less than or equal to the first threshold number (N at operation 1213), the process 12000A may return to operation 1211.

Based on determining that the number of unprogrammed cells is less than or equal to the first threshold number (Y at operation 1213), the process 12000A may proceed to operation 1214, which may include determining whether the number of unprogrammed cells is less than or equal to a second threshold number. In embodiments, the second threshold number may correspond to the number $N_{full}$.

Based on determining that the number of unprogrammed cells is less than or equal to the second threshold number (Y at operation 1214), the process 12000A may proceed to operation 1219, which may include writing a next word to a next word line.

Based on determining that the number of unprogrammed cells is not less than or equal to the first threshold number (N at operation 1214), the process 12000A may proceed to operation 1215, which may include providing information about the first word line to a machine learning model. In embodiments, the information about the first word line may correspond to the vector 1101 of word line features (e.g., the vector X), and the machine learning model may correspond to the machine learning model 1102. In embodiments, the information about the first word line may indicate the number of the unprogrammed cells, a number of first programming pulses applied to the first word line to write the word, and an index of the first word line. In embodiments, the machine learning model may be a neural network, for example a multi-class neural network.

As further shown in FIG. 12A, at operation 1216 the process 12000A may include determining whether to continue to write the word to the first word line. Based on determining to continue to write the word to the first word line (Y at operation 1216), the process 12000A may proceed to operation 1217, which may include continuing to write the word to the first word line, for example by applying additional programming pulses to the first word line, and then may proceed to operation 1219. Based on determining not to continue to write the word to the first word line (N at operation 1216), the process 12000A may proceed to operation 1218, which may include writing the remainder data to a second word line, and then may proceed to operation 1219.

In embodiments, operation 1217 may correspond to Path A, and operation 1218 may correspond to Path B, however embodiments are not limited thereto.

In embodiments, the writing the remainder data to the second word line may include compressing the remainder data and storing the compressed remainder data in a buffer, and based on determining that the buffer is full, writing the compressed remainder data to the second word line. In embodiments, the buffer may include compressed additional remainder data corresponding to one or more additional word lines, and the compressed additional remainder data may be written to the second word line along with the compressed remainder data.

FIG. 12B is a flowchart of a process 12000B of controlling a storage device, according to embodiments. In some implementations, one or more process blocks of FIG. 12B may be performed by any of the elements discussed above, for example one or more of the storage device 200 and any of the elements included therein, for example the storage controller 210, the NVM 220, and the VM 230.

As shown in FIG. 12B, at operation 1221 the process 12000B may include determining an expected number of second programming pulses for reducing the number of unprogrammed cells in the first word line to below the second threshold, and an expected number of third programming pulses for writing the remainder data to the second word line, based on the output of the machine learning model. In embodiments, the expected number of second programming pulses may correspond to the expected cost $Cost_A$, and the expected number of third programming pulses may correspond to the expected cost $Cost_B$.

As further shown in FIG. 12B, at operation 1222 the process 12000B may include determining whether the expected number of second programming pulses is less than or equal to the expected number of third programming pulses. Based on determining that the expected number of second programming pulses is less than or equal to the expected number of third programming pulses (Y at operation 1222), the process 12000B may proceed to operation 1223, which may include determining to continue to write the word to the first word line. Based on determining that the expected number of second programming pulses is not less than or equal to the expected number of third programming pulses (N at operation 1222), the process 12000B may proceed to operation 1224, which may include determining not to continue to write the word to the first word line.

In embodiments, one or more process blocks of FIG. 12B may correspond to one or more process blocks of FIG. 12A, for example operation 1216. According to embodiments, after operation 1223 is performed, process 12000A may proceed to operation 1217. According to embodiments, after operation 1224 is performed, process 12000A may proceed to operation 1218. However, embodiments are not limited thereto.

Although FIGS. 10, 12A, and 12B show example blocks of processes 10000, 1200A, and 1200B, in some implementations, the processes 10000, 12000A, and 12000B may include additional blocks, fewer blocks, different blocks, or differently arranged blocks than those depicted in FIGS. 10, 12A, and 12B. Additionally, or alternatively, two or more of the blocks of the processes 1000, 1200A, and 1200B may be arranged or combined in any order, or performed in parallel.

Figure 13:
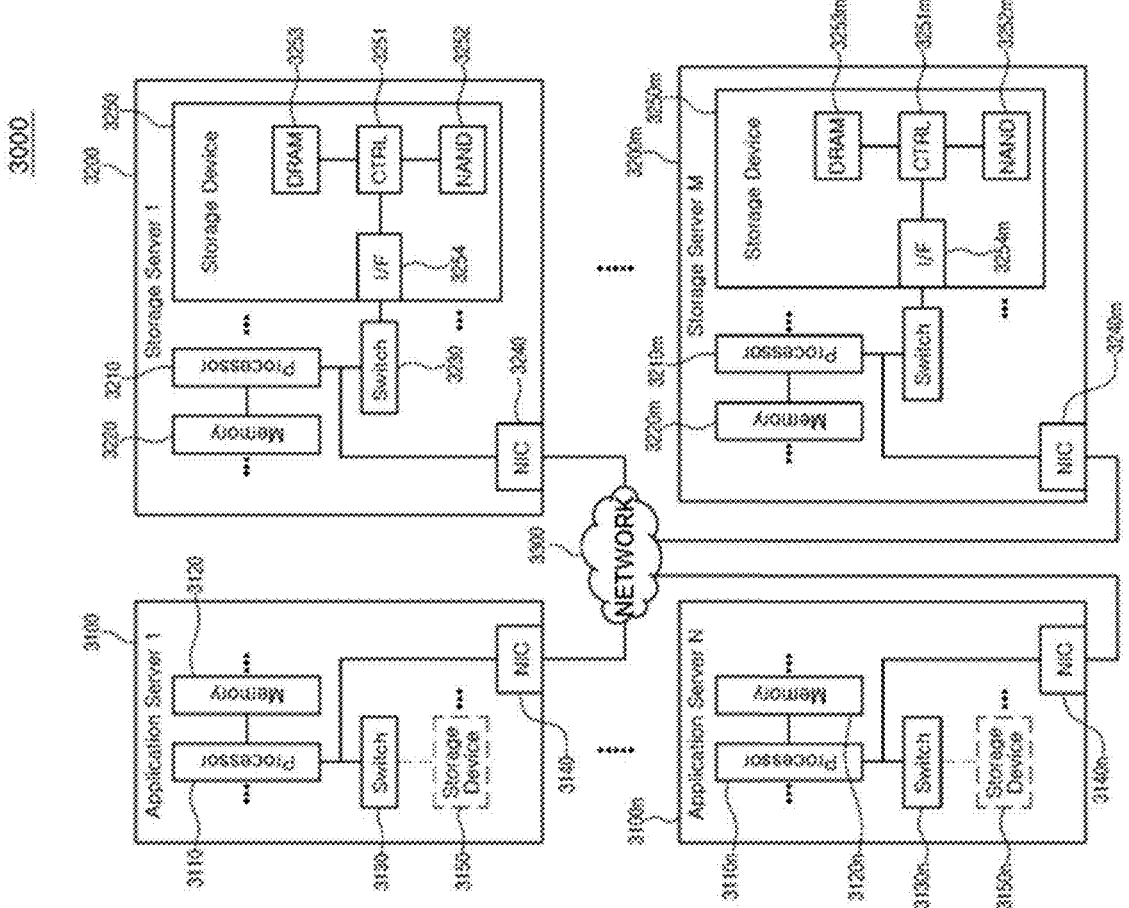
FIG. 13 is a block diagram of data center, according to embodiments.

FIG. 13 is a diagram of a data center 3000 to which a memory device is applied, according to embodiments.

Referring to FIG. 13, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100*n* and storage servers 3200 to 3200*m*. The number of application servers 3100 to 3100*n* and the number of storage servers 3200 to 3200*m* may be variously selected according to embodiments. The number of application servers 3100 to 3100*n* may be different from the number of storage servers 3200 to 3200*m*.

The application server 3100 or the storage server 3200 may include at least one of processors 3110 and 3210 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In embodiments, the processor 3210 and the memory 3220 may provide a processor-memory pair. In embodiments, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include a storage device 3150. The storage server 3200 may include at least one storage device 3250. The number of storage devices 3250 included in the storage server 3200 may be variously selected according to embodiments.

The application servers 3100 to 3100*n* may communicate with the storage servers 3200 to 3200*m* through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200*m* may be provided as file storages, block storages, or object storages according to an access method of the network 3300.

In embodiments, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCOE), network attached storage (NAS), and NVMe over Fabrics (NVMe-oF).

Hereinafter, the application server 3100 and the storage server 3200 will mainly be described. A description of the application server 3100 may be applied to another application server 3100*n*, and a description of the storage server 3200 may be applied to another storage server 3200*m*.

The application server 3100 may store data, which is requested by a user or a client to be stored, in one of the storage servers 3200 to 3200*m* through the network 3300. Also, the application server 3100 may obtain data, which is requested by the user or the client to be read, from one of the storage servers 3200 to 3200*m* through the network 3300. For example, the application server 3100 may be implemented as a web server or a database management system (DBMS).

The application server 3100 may access a memory 3120*n* or a storage device 3150*n*, which is included in another application server 3100*n*, through the network 3300. Alternatively, the application server 3100 may access memories 3220 to 3220*m* or storage devices 3250 to 3250*m*, which are included in the storage servers 3200 to 3200*m*, through the network 3300. Thus, the application server 3100 may perform various operations on data stored in application servers 3100 to 3100*n* and/or the storage servers 3200 to 3200*m*. For example, the application server 3100 may execute an instruction for moving or copying data between the application servers 3100 to 3100*n* and/or the storage servers 3200 to 3200*m*. In this case, the data may be moved from the storage devices 3250 to 3250*m* of the storage servers 3200 to 3200*m* to the memories 3120 to 3120*n* of the application servers 3100 to 3100*n* directly or through the memories 3220 to 3220*m* of the storage servers 3200 to 3200*m*. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC (Network InterConnect) 3240. The switch 3230 may selectively connect the processor 3210 to the storage device 3250 or selectively connect the NIC 3240 to the storage device 3250 via the control of the processor 3210.

In embodiments, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In embodiments, the NIC 3240 may be integrated with at least one of the processor 3210, the switch 3230, and the storage device 3250.

In the storage servers 3200 to 3200*m* or the application servers 3100 to 3100*n*, a processor may transmit a command to storage devices 3150 to 3150*n* and 3250 to 3250*m* or the memories 3120 to 3120*n* and 3220 to 3220*m* and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150*n* and 3250 to 3250*m* may transmit a control signal and a command/address signal to NAND flash memory devices 3252 to 3252*m* in response to a read command received from the processor. Thus, when data is read from the NAND flash memory devices 3252 to 3252*m*, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In embodiments, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210*m* of another storage server 3200*m*, or the processors 3110 and 3110*n* of the application servers 3100 and 3100*n*. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of certain embodiments and is not to be construed as limiting thereof. Although a few embodiments have been described, those skilled in the art will readily appreciate that many modifications are possible in the embodiments without materially departing from the present scope.

What is claimed is:

1. A storage device, comprising:
a volatile memory;
a non-volatile memory; and
a storage controller:
wherein, based on detecting a power loss corresponding to the storage device, the storage controller is configured to:
obtain a word stored in the volatile memory;
write the word to a first word line from among a plurality of word lines included in the non-volatile memory;
compare a number of unprogrammed cells included in the first word line to a first threshold number and a second threshold number, wherein the unprogrammed cells correspond to remainder data included in the word;
based on determining that the number of unprogrammed cells is less than or equal to the first threshold number and greater than the second threshold number, determine whether to continue writing the word to the first word line by providing information about the first word line to a machine learning model; and
based on determining not to continue writing the word to the first word line, write the remainder data to a second word line from among the plurality of word lines.

2. The storage device of claim 1, wherein the information about the first word line indicates the number of the unprogrammed cells, a number of first programming pulses applied to the first word line to write the word, and an index of the first word line.

3. The storage device of claim 2, wherein to determine whether to continue writing the word to the first word line, the storage controller is further configured to:
based on an output of the machine learning model, determine an expected number of second programming pulses for reducing the number of unprogrammed cells in the first word line to below the second threshold number, and an expected number of third programming pulses for writing the remainder data to the second word line;
based on the expected number of second programming pulses being less than or equal to the expected number of third programming pulses, determine to continue writing the word to the first word line; and based on the expected number of third programming pulses being less than the expected number of second programming pulses, determine not to continue writing the word to the first word line.

4. The storage device of claim 1, wherein the machine learning model comprises a multi-class neural network.

5. The storage device of claim 1, wherein to write the remainder data to the second word line, the storage controller is further configured to:

compress the remainder data and storing the compressed remainder data in a buffer; and based on determining that the buffer is full, write the compressed remainder data to the second word line.

6. The storage device of claim 5, wherein the buffer includes compressed additional remainder data corresponding to one or more additional word lines, and wherein the compressed additional remainder data is written to the second word line along with the compressed remainder data.

7. A storage controller for controlling a storage device, the storage controller comprising:

at least one processor, wherein, based on detecting a power loss corresponding to the storage device, the at least one processor is configured to:

obtain a word from a volatile memory included in the storage device;

apply first programming pulses to a first word line from among a plurality of word lines to write the word to the first word line, wherein the plurality of word lines are included in a non-volatile memory included in the storage device;

determine a number of unprogrammed cells, wherein the unprogrammed cells correspond to remainder data included in the word;

based on determining that the number of unprogrammed cells is less than or equal to a first threshold number, determine an expected number of second programming pulses for reducing the number of unprogrammed cells in the first word line to below a second threshold number, and an expected number of third programming pulses for writing the remainder data to a second word line;

compare the expected number of second programming pulses and the expected number of third programming pulses to obtain a comparison result; and write the remainder data to the first word line or the second word line based on the comparison result.

8. The storage controller of claim 7, wherein based on the comparison result indicating that the expected number of second programming pulses is less than or equal to the expected number of third programming pulses, the remainder data is written to the first word line, and wherein based on the comparison result indicating that the expected number of third programming pulses is less than the expected number of second programming pulses, the remainder data is written to the second word line.

9. The storage controller of claim 7, wherein the at least one processor is further configured to:

compress the remainder data; and determine the expected number of second programming pulses based on the compressed remainder data.

10. The storage controller of claim 9, wherein the expected number of second programming pulses is determined by providing information about the first word line to a machine learning model, and wherein the expected number of third programming pulses is determined based on the expected number of second programming pulses and a compression ratio of the compressed remainder data.

11. The storage controller of claim 9, wherein to write the remainder data to the second word line, the at least one processor is further configured to:

store the compressed remainder data in a buffer; and based on determining that the buffer is full, write the compressed remainder data to the second word line.

12. The storage controller of claim 11, wherein the buffer includes compressed additional remainder data corresponding to one or more additional word lines, and wherein the compressed additional remainder data is written to the second word line along with the compressed remainder data.

13. A method of storing data in a storage device, the method comprising:

writing a word to a first word line from among a plurality of word lines;

comparing a number of unprogrammed cells included in the first word line to a first threshold number and a second threshold number, wherein the unprogrammed cells correspond to remainder data included in the word;

based on determining that the number of unprogrammed cells is less than or equal to the first threshold number and greater than the second threshold number, determining whether to continue writing the word to the first word line by providing information about the first word line to a machine learning model; and based on determining not to continue writing the word to the first word line, writing the remainder data to a second word line from among the plurality of word lines.

14. The method of claim 13, wherein the information about the first word line indicates the number of the unprogrammed cells, a number of first programming pulses applied to the first word line to write the word, and an index of the first word line.

15. The method of claim 14, wherein the determining whether to continue writing the word to the first word line comprises:

based on an output of the machine learning model, determining an expected number of second programming pulses for reducing the number of unprogrammed cells in the first word line to below the second threshold number, and an expected number of third programming pulses for writing the remainder data to the second word line;

based on the expected number of second programming pulses being less than or equal to the expected number of third programming pulses, determining to continue writing the word to the first word line; and based on the expected number of third programming pulses being less than the expected number of second programming pulses, determining not to continue writing the word to the first word line.

16. The method of claim 13, wherein the machine learning model comprises a multi-class neural network.

17. The method of claim 13, wherein the writing the remainder data to the second word line comprises:

compressing the remainder data and storing the compressed remainder data in a buffer; and based on determining that the buffer is full, writing the compressed remainder data to the second word line.

18. The method of claim 17, wherein the buffer includes compressed additional remainder data corresponding to one or more additional word lines, and wherein the compressed additional remainder data is written to the second word line along with the compressed remainder data.

\* \* \* \* \*